United States Patent
Park et al.

(10) Patent No.: US 10,580,964 B2
(45) Date of Patent: Mar. 3, 2020

(54) MEMORY DEVICE

(71) Applicant: Industry-University Cooperation Foundation Hanyang University, Seoul (KR)

(72) Inventors: Jea Gun Park, Seongnam-si (KR); Du Yeong Lee, Seoul (KR); Song Hwa Hong, Seoul (KR); Jin Young Choi, Seoul (KR); Seung Eun Lee, Seoul (KR); Junli Li, Seoul (KR)

(73) Assignee: Industry-University Cooperation Foundation Hanyang University, Seoul (KR)

( * ) Notice: Subject to any disclaimer, the term of this patent is extended or adjusted under 35 U.S.C. 154(b) by 167 days.

(21) Appl. No.: 15/707,491

(22) Filed: Sep. 18, 2017

(65) Prior Publication Data
US 2018/0006213 A1 Jan. 4, 2018

Related U.S. Application Data

(63) Continuation-in-part of application No. PCT/KR2016/001124, filed on Feb. 2, 2016, and a
(Continued)

(30) Foreign Application Priority Data

Mar. 18, 2015 (KR) .................. 10-2015-0037230
Mar. 18, 2015 (KR) .................. 10-2015-0037231
(Continued)

(51) Int. Cl.
*G11C 11/16* (2006.01)
*H01L 43/08* (2006.01)
(Continued)

(52) U.S. Cl.
CPC .............. *H01L 43/02* (2013.01); *G11C 11/15* (2013.01); *G11C 11/16* (2013.01); *G11C 11/161* (2013.01);
(Continued)

(58) Field of Classification Search
None
See application file for complete search history.

(56) References Cited

U.S. PATENT DOCUMENTS 8,959,250 B2 * 2/2015 Lee .................. H01L 43/08
710/7
2012/0292724 A1 11/2012 Lim et al.
(Continued)

FOREIGN PATENT DOCUMENTS

JP 2011-003869 A 1/2011
JP 10-2014-0025165 A 3/2014
(Continued)

OTHER PUBLICATIONS

International Search Report for PCT/KR2016/001124, dated May 12, 2016.
(Continued)

*Primary Examiner* — Minh Loan Tran
(74) *Attorney, Agent, or Firm* — Sughrue Mion, PLLC

(57) ABSTRACT

The present invention relates to a memory device including a substrate and a lower electrode, buffer layer, seed layer, Magnetic Tunnel Junction (MTJ), capping layer, synthetic antiferromagnetic layer, and upper electrode formed on the substrate.

19 Claims, 16 Drawing Sheets

Related U.S. Application Data continuation-in-part of application No. PCT/KR2016/001137, filed on Feb. 2, 2016, and a continuation-in-part of application No. PCT/KR2016/001134, filed on Feb. 2, 2016, and a continuation-in-part of application No. PCT/KR2016/001130, filed on Feb. 2, 2016, and a continuation-in-part of application No. PCT/KR2016/001135, filed on Feb. 2, 2016.

(30) Foreign Application Priority Data

| | | |
|---|---|---|
| Mar. 18, 2015 | (KR) | 10-2015-0037232 |
| Mar. 18, 2015 | (KR) | 10-2015-0037233 |
| Mar. 18, 2015 | (KR) | 10-2015-0037234 |
| Mar. 31, 2015 | (KR) | 10-2015-0045171 |
| Mar. 31, 2015 | (KR) | 10-2015-0045172 |
| Mar. 31, 2015 | (KR) | 10-2015-0045173 |
| Mar. 31, 2015 | (KR) | 10-2015-0045174 |

(51) Int. Cl.

| | |
|---|---|
| H01L 43/02 | (2006.01) |
| H01L 27/22 | (2006.01) |
| H01L 43/10 | (2006.01) |
| H01L 43/12 | (2006.01) |
| G11C 11/15 | (2006.01) |

(52) U.S. Cl.
CPC ............ H01L 27/226 (2013.01); H01L 43/08 (2013.01); H01L 43/10 (2013.01); H01L 43/12 (2013.01)

(56) References Cited

U.S. PATENT DOCUMENTS

| | | | |
|---|---|---|---|
| 2014/0072828 A1 | 3/2014 | Inaba et al. | |
| 2014/0197504 A1* | 7/2014 | Moriyama | G11C 11/161 257/421 |
| 2015/0035095 A1* | 2/2015 | Kim | H01L 43/08 257/421 |

FOREIGN PATENT DOCUMENTS

| | | |
|---|---|---|
| KR | 10-2006-0069879 A | 6/2006 |
| KR | 10-1040163 B | 6/2011 |
| KR | 10-2011-0133595 A | 12/2011 |
| KR | 10-1195041 B1 | 10/2012 |
| KR | 10-2013-0071406 A | 6/2013 |
| KR | 10-2014-0011138 A | 1/2014 |
| KR | 10-2015-0015601 A | 2/2015 |
| KR | 10-2015-0015602 A | 2/2015 |
| KR | 10-2015-0015927 A | 2/2015 |

OTHER PUBLICATIONS

International Search Report for PCT/KR2016/001135, dated Jun. 8, 2016.
International Search Report for PCT/KR2016/001134, dated Jun. 8, 2016.
International Search Report for PCT/KR2016/001130, dated May 13, 2016.
International Search Report for PCT/KR2016/001137 dated May 12, 2016.
Office Action issued by the CNIPA dated Jul. 29, 2019 for corresponding Chinese Patent Application No. 201680016553.3.
Office Action dated Apr. 1, 2019 by the Chinese Patent Office in corresponding Chinese Patent Application No. 201680016542.5.
Kay Yakushiji et al, "Ultralow-Voltage Spin-Transfer Switching in Perpendicularly Magnetized Magnetic Tunnel Junctions with Synthetic Antiferromagnetic Reference Layer", 2013 Appl. Phys. Express 6 113006.

* cited by examiner

[FIG. 1]
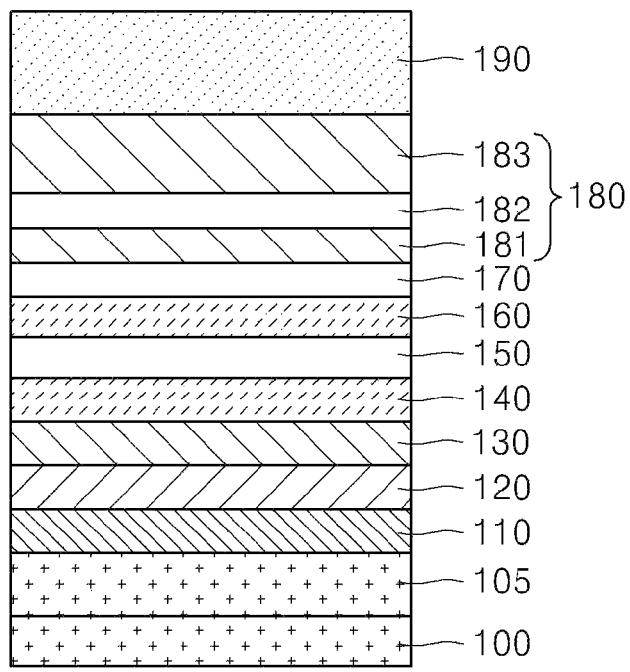
[FIG. 2]
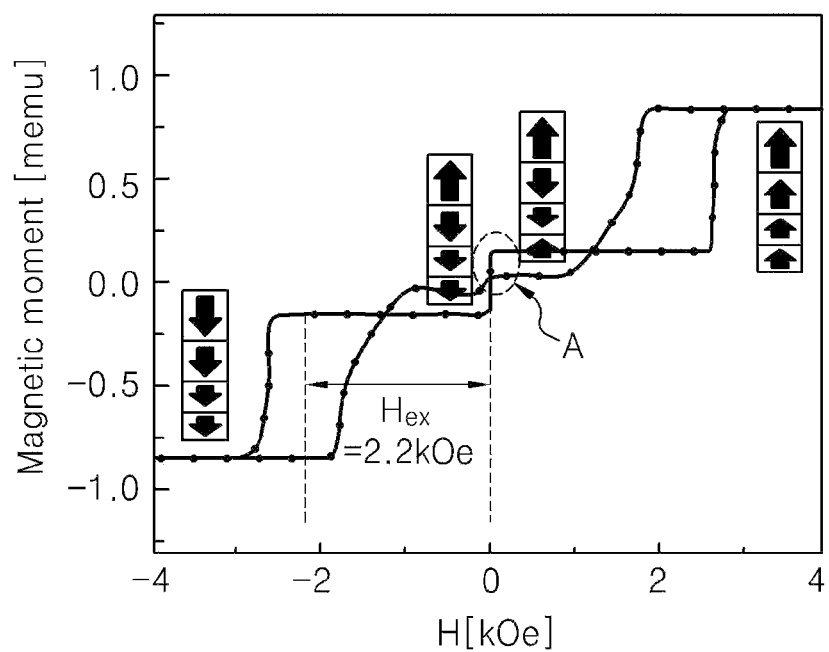

[FIG. 3]
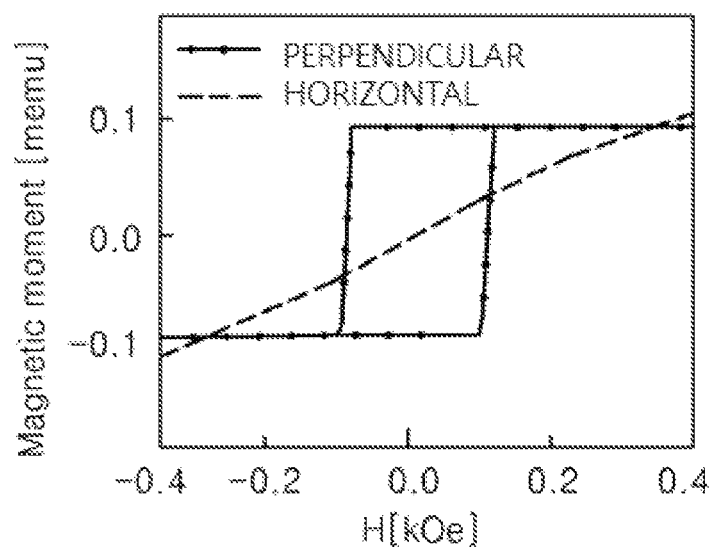
[FIG. 4]
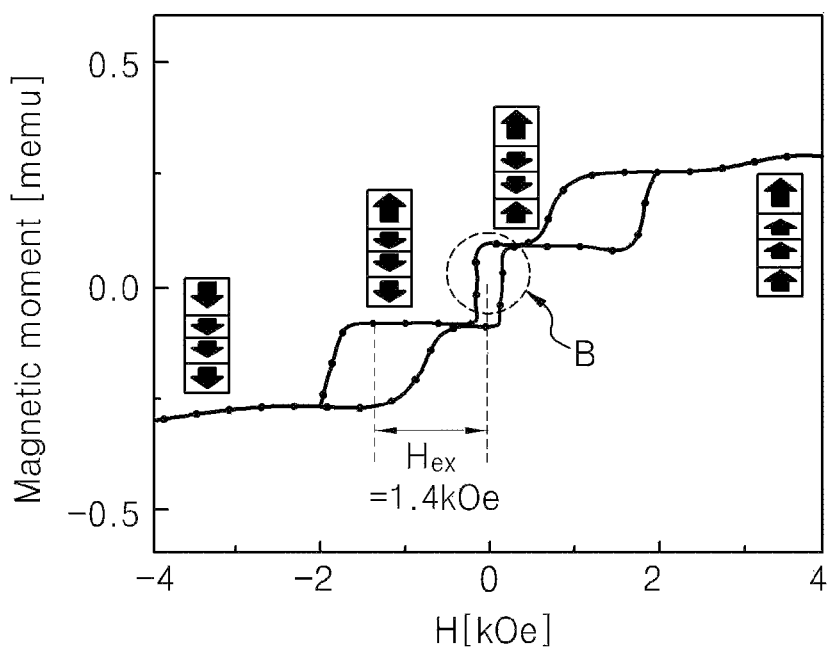

[FIG. 5]
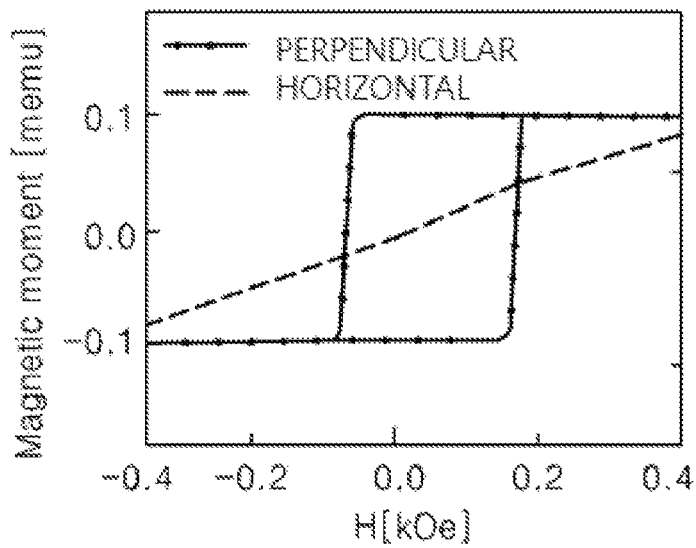
[FIG. 6]
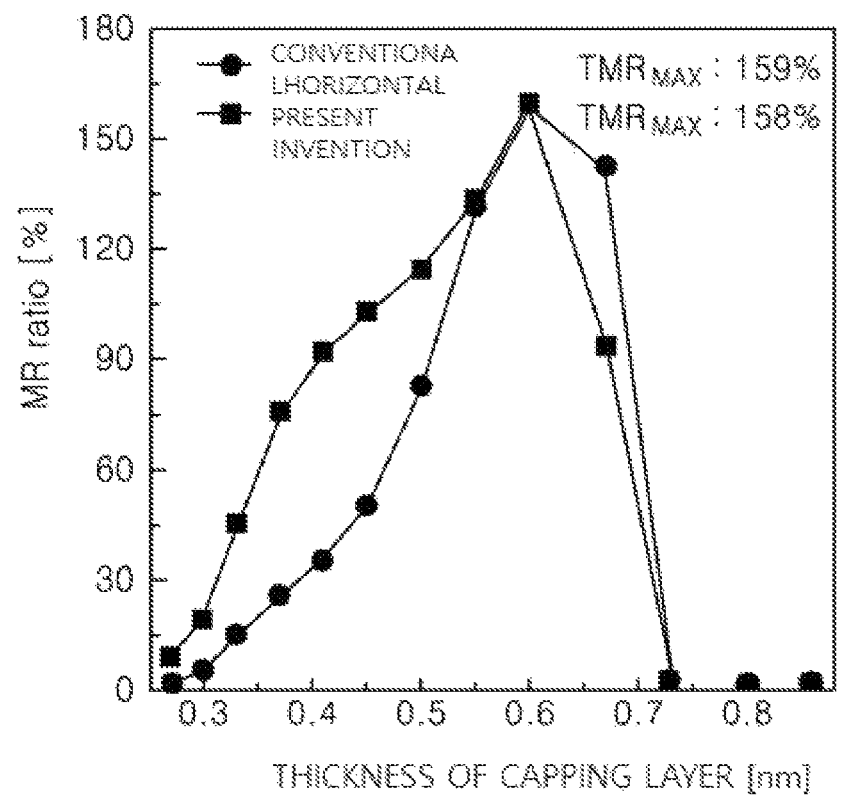

[FIG. 7]
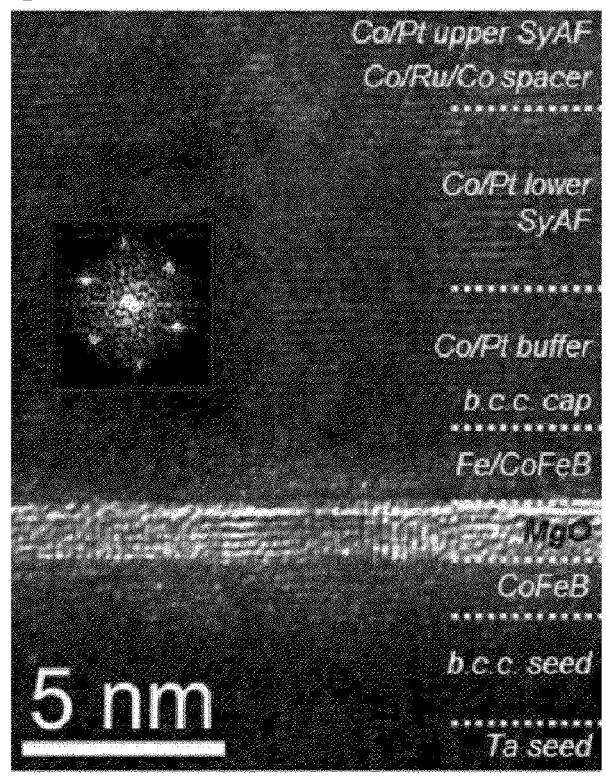
[FIG. 8]
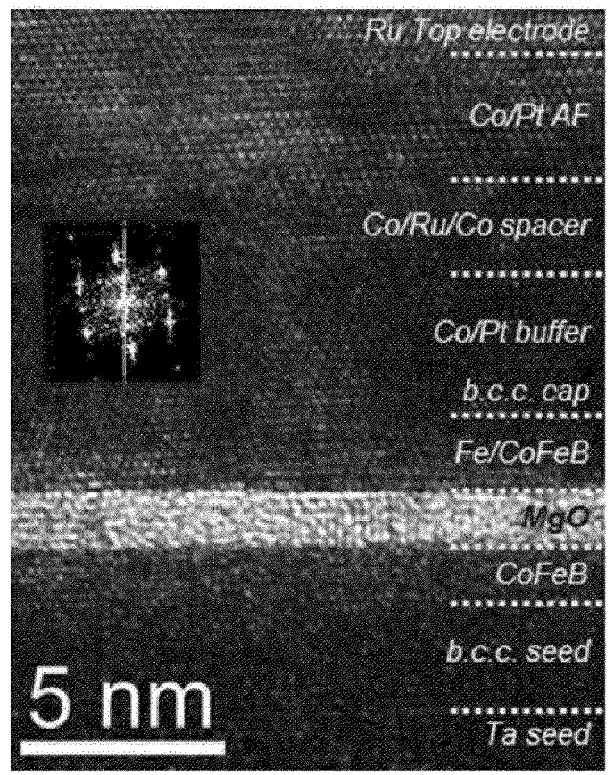

[FIG. 9]
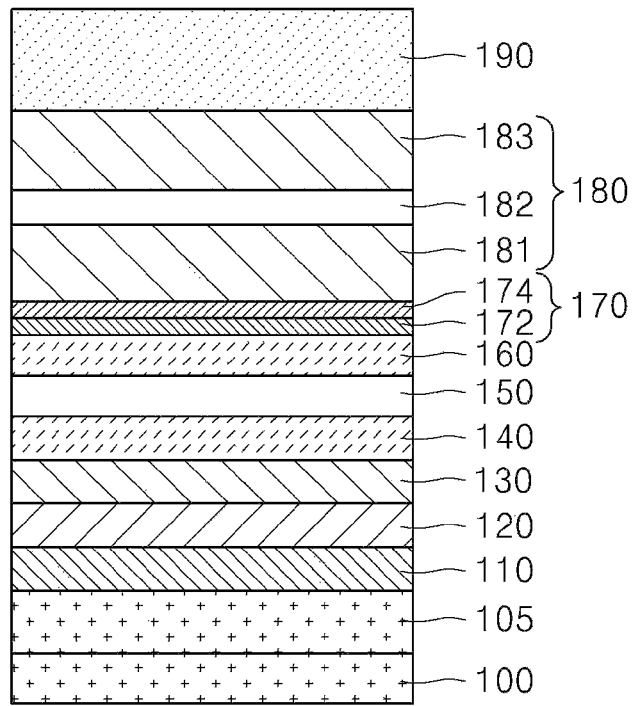
[FIG. 10]
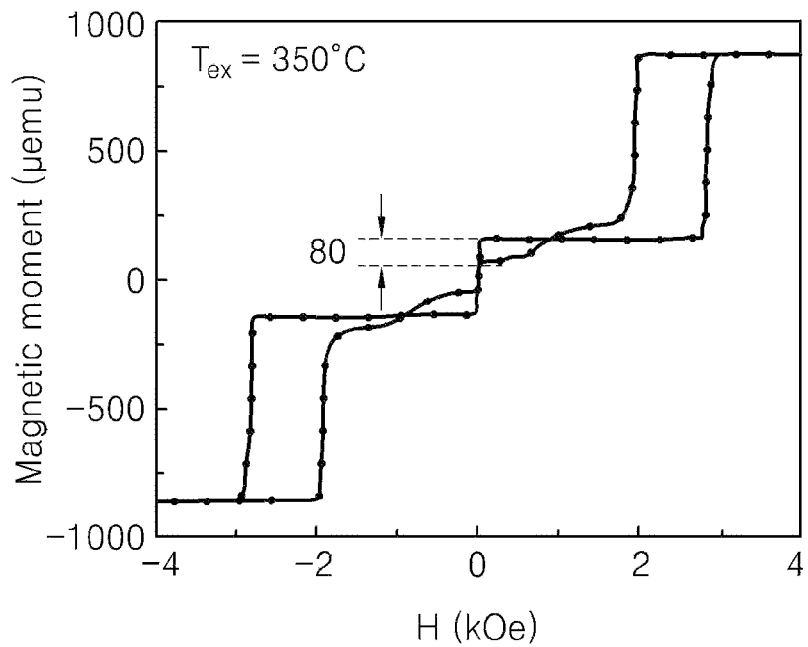

[FIG. 11]
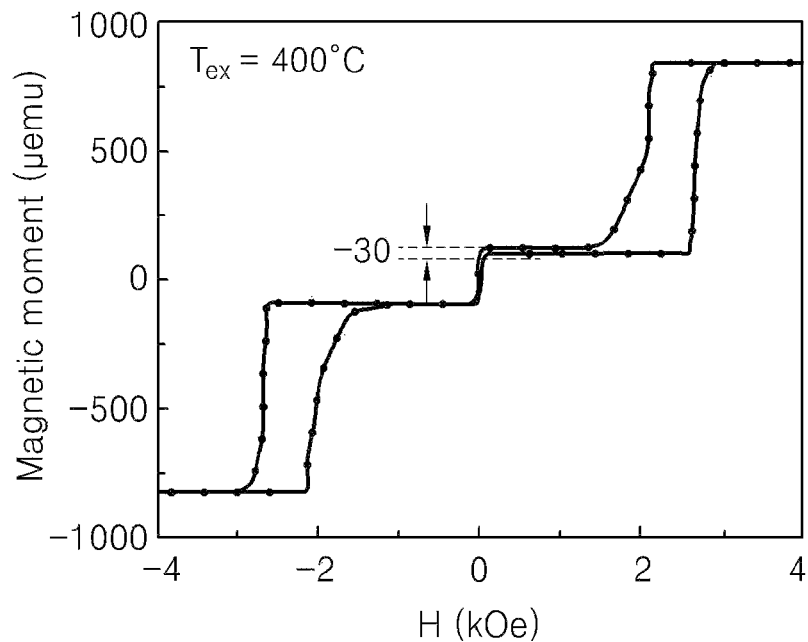
[FIG. 12]
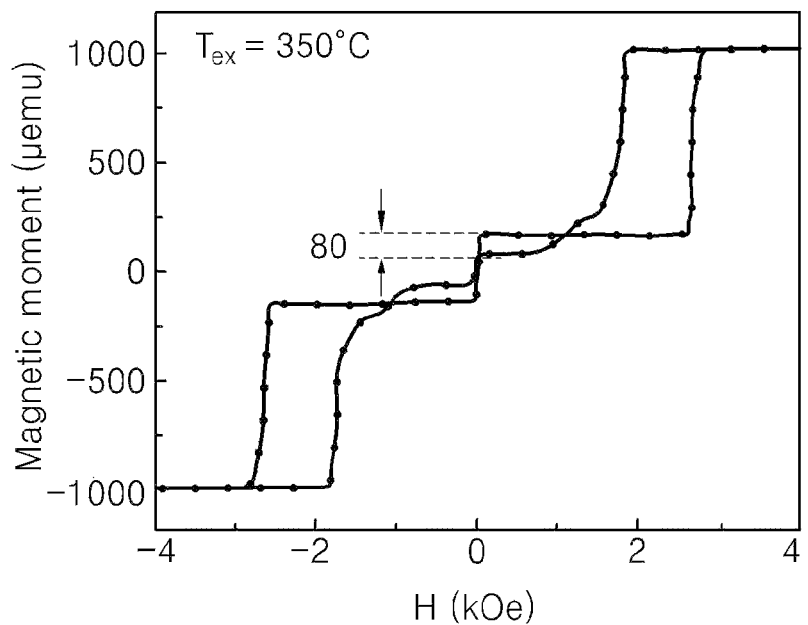

[FIG. 13]
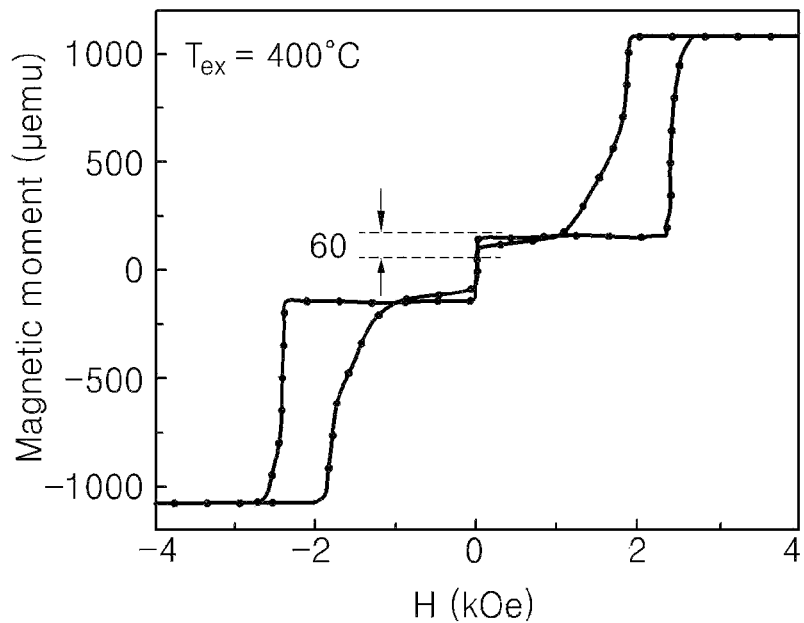
[FIG. 14]
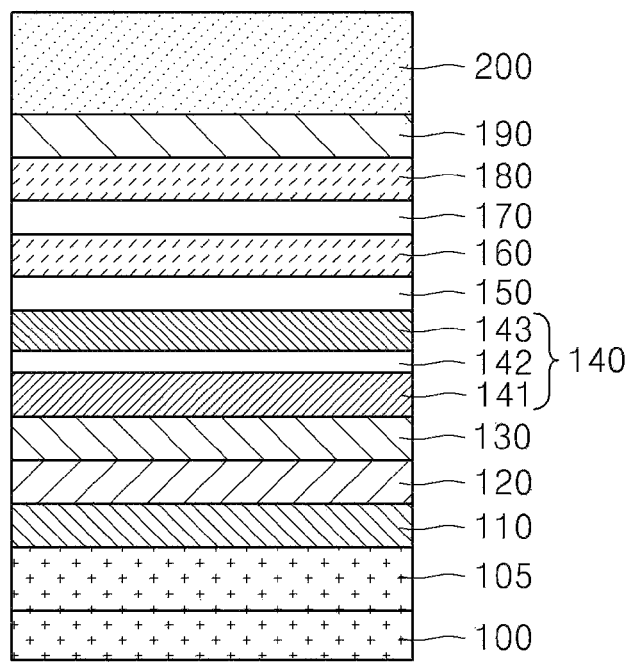

[FIG. 15]
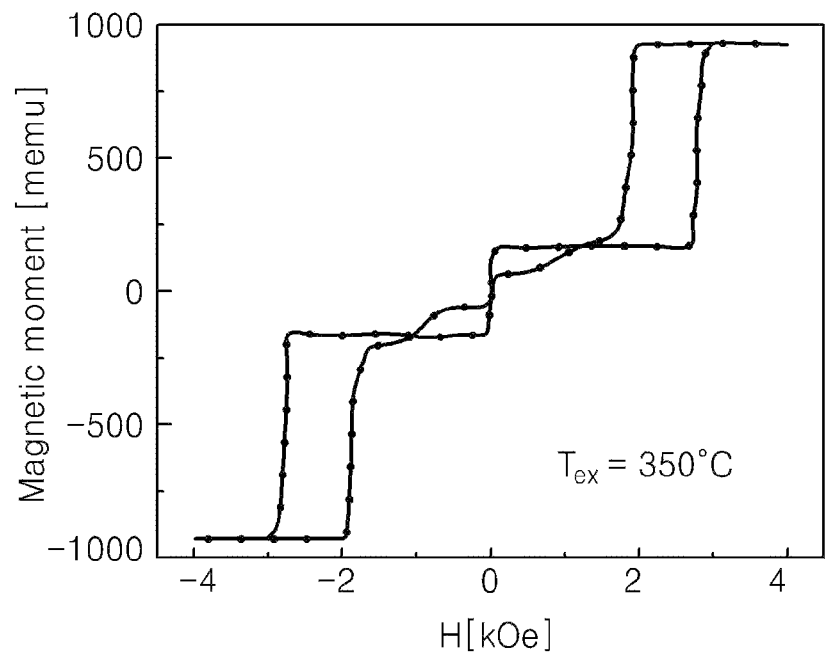
[FIG. 16]
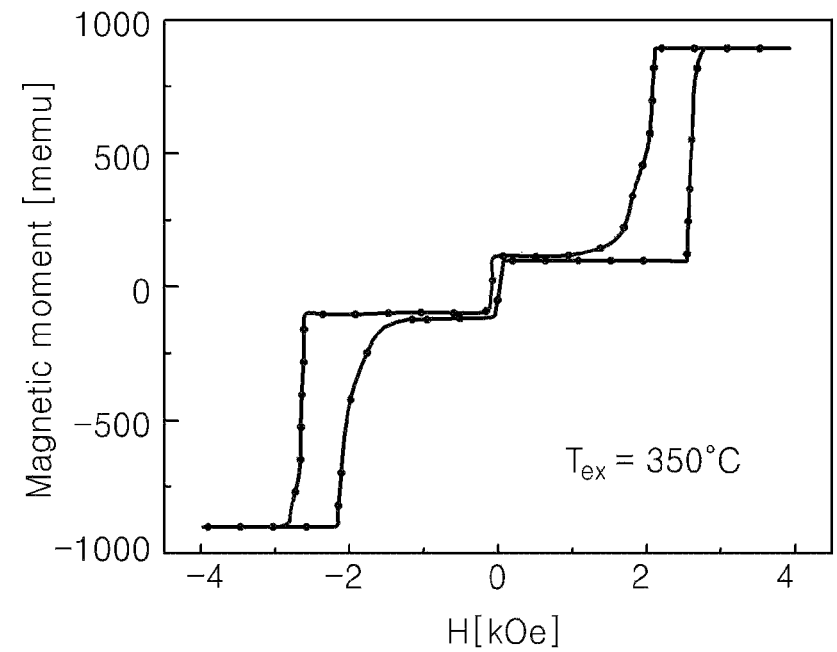

[FIG. 17]
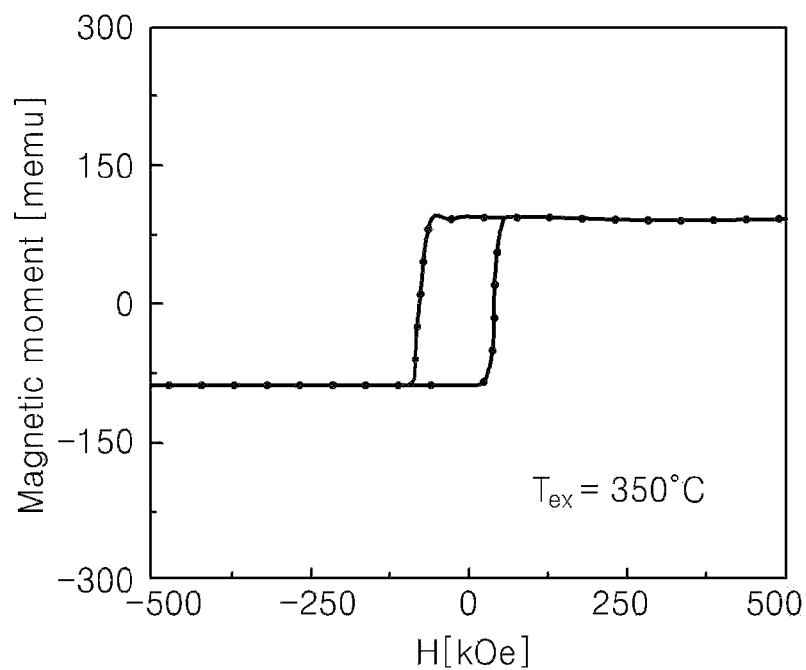
[FIG. 18]
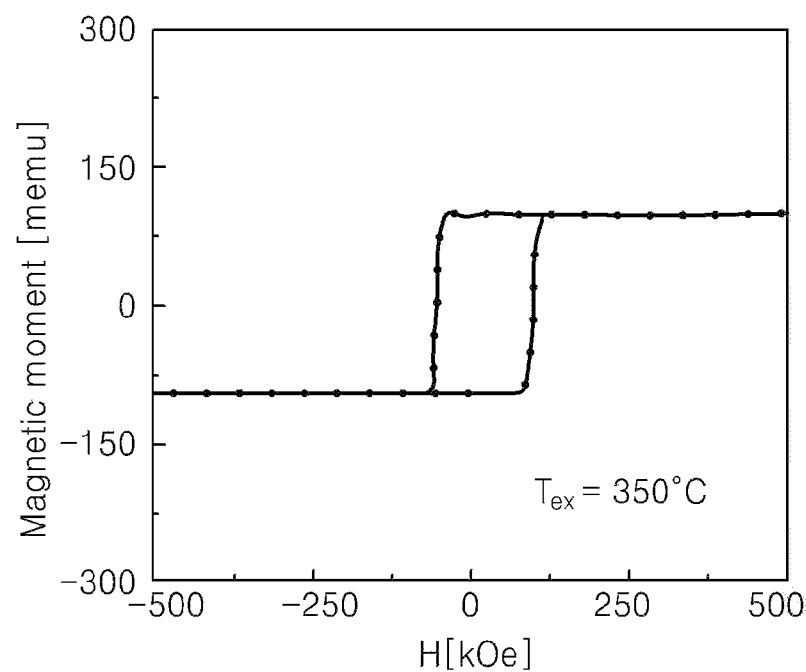

[FIG. 19]
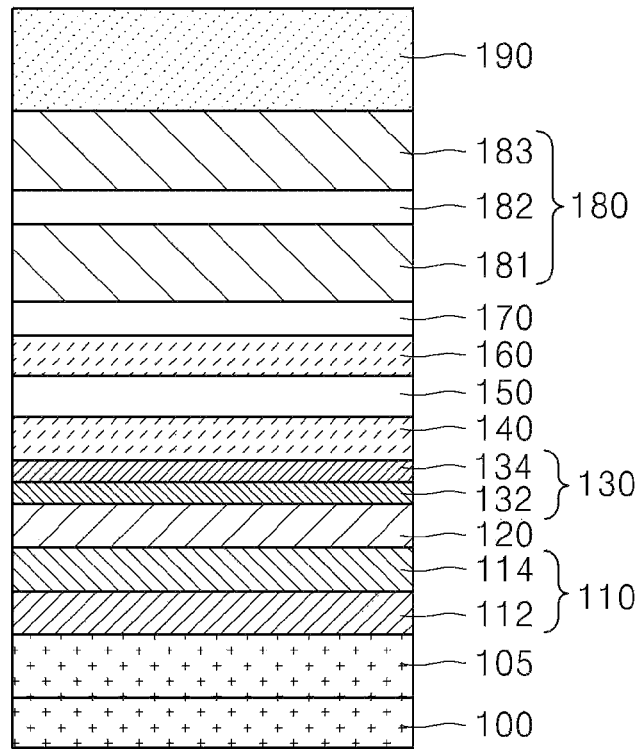
[FIG. 20]
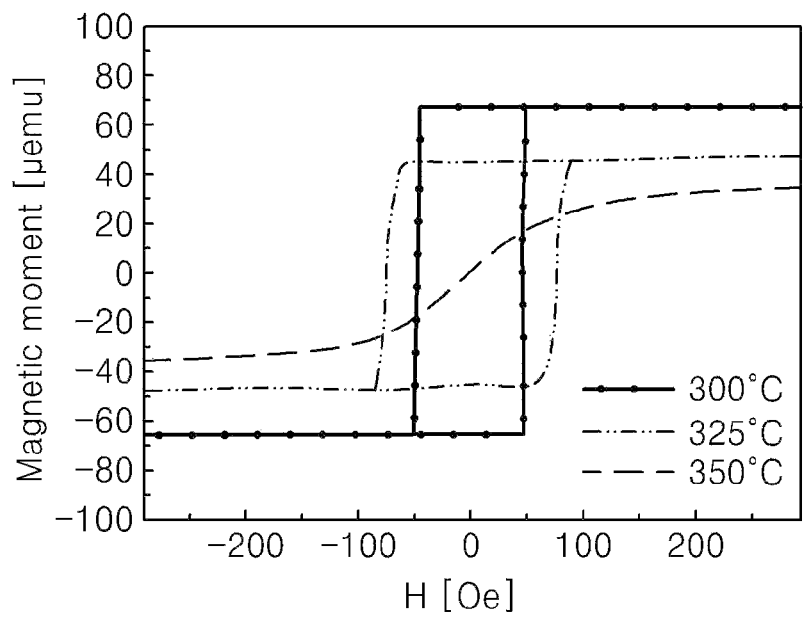

[FIG. 21]
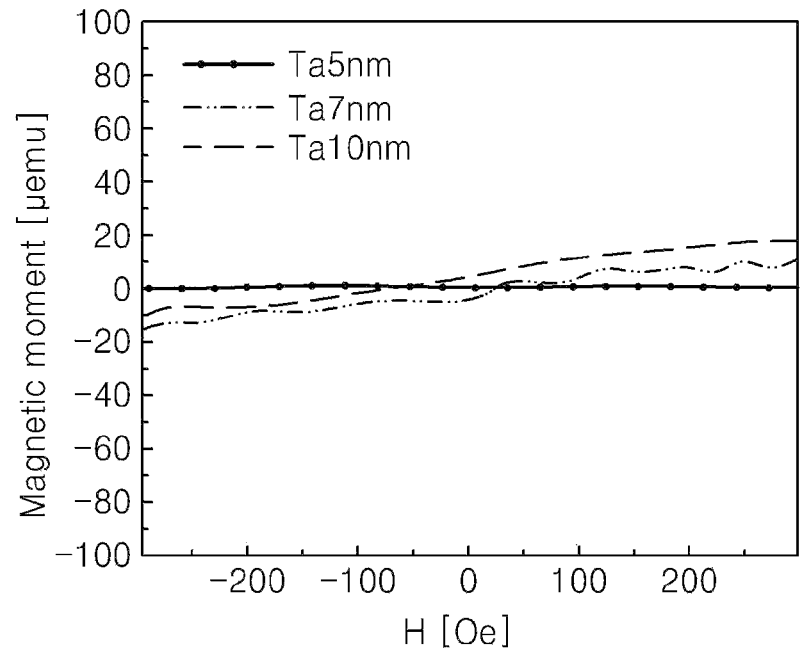
[FIG. 22]
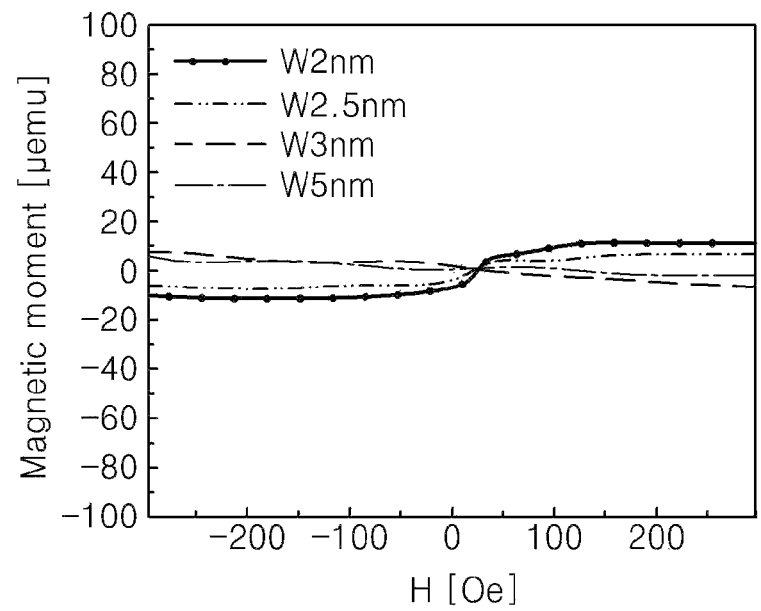

[FIG. 23]
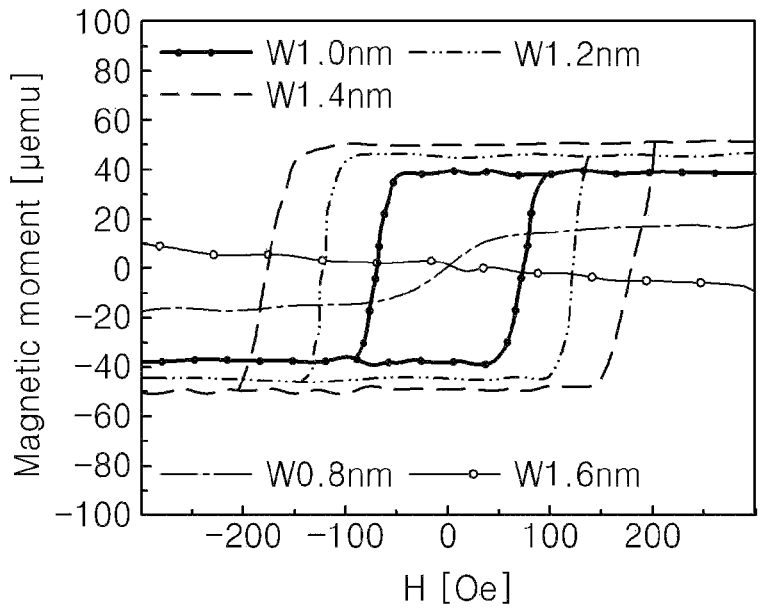
[FIG. 24]
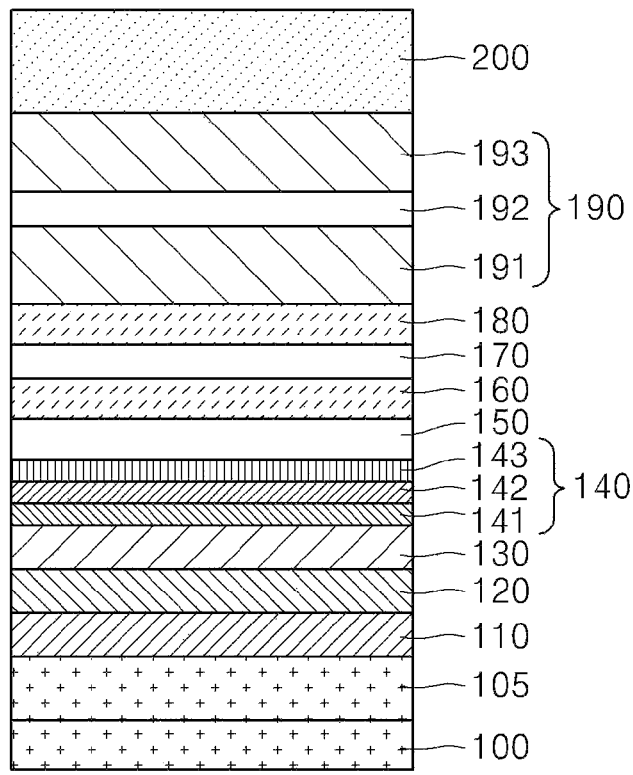

【FIG. 25】
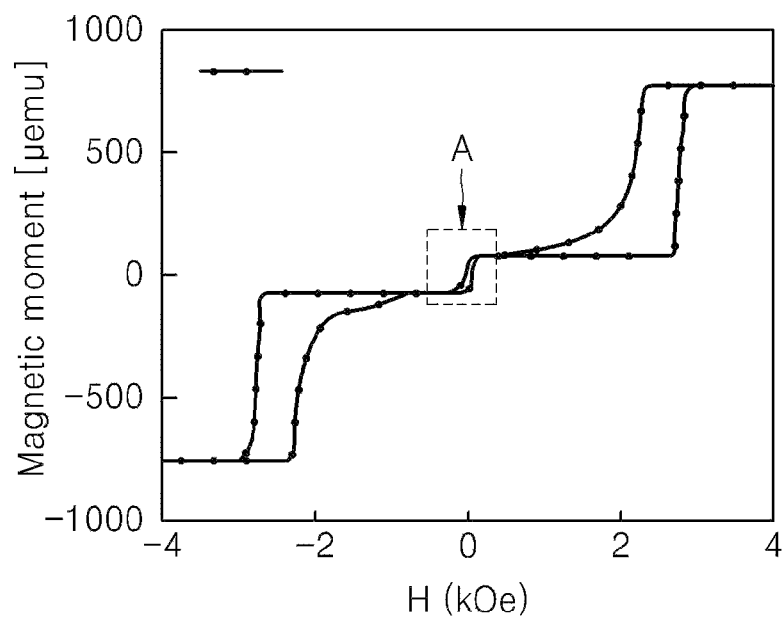
【FIG. 26】
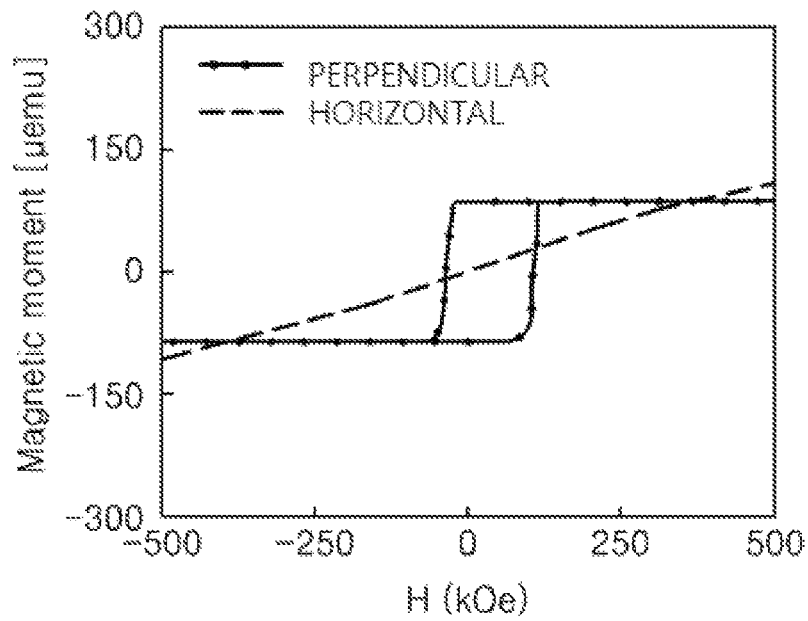

【FIG. 27】
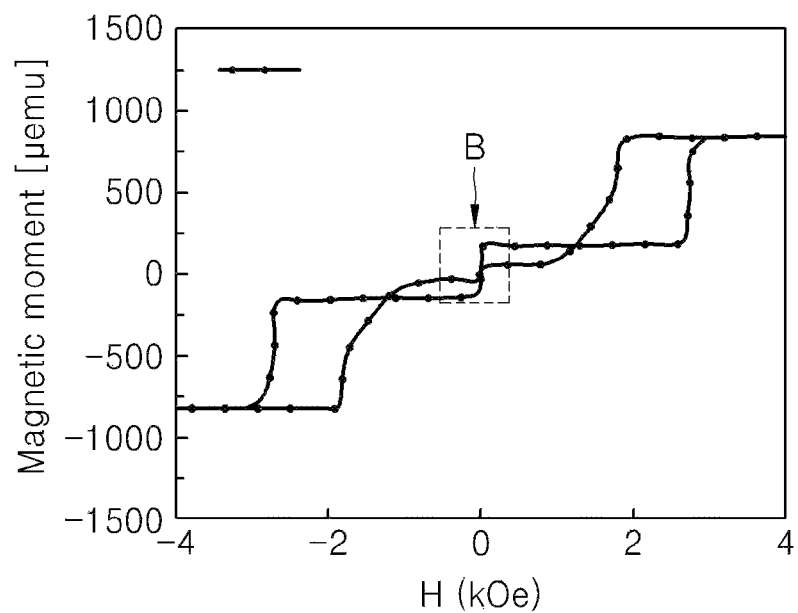
【FIG. 28】
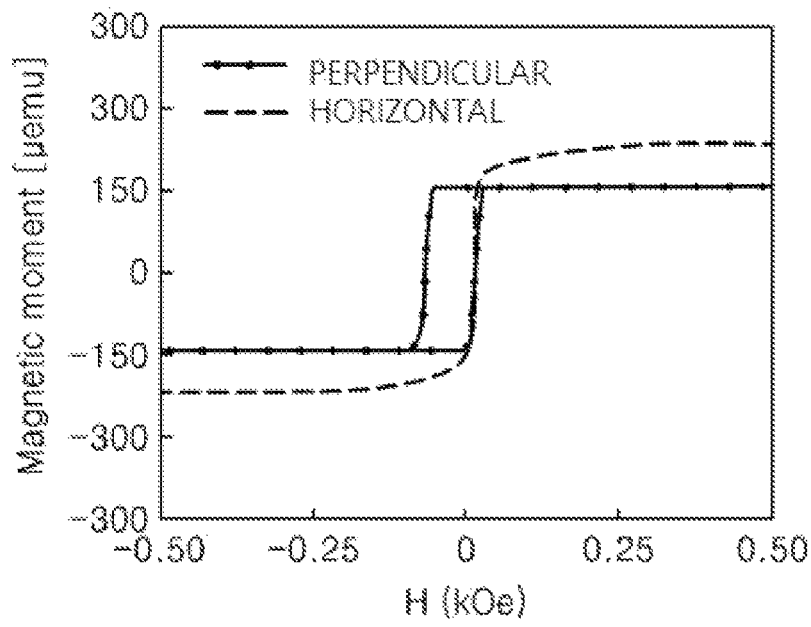

[FIG. 29]
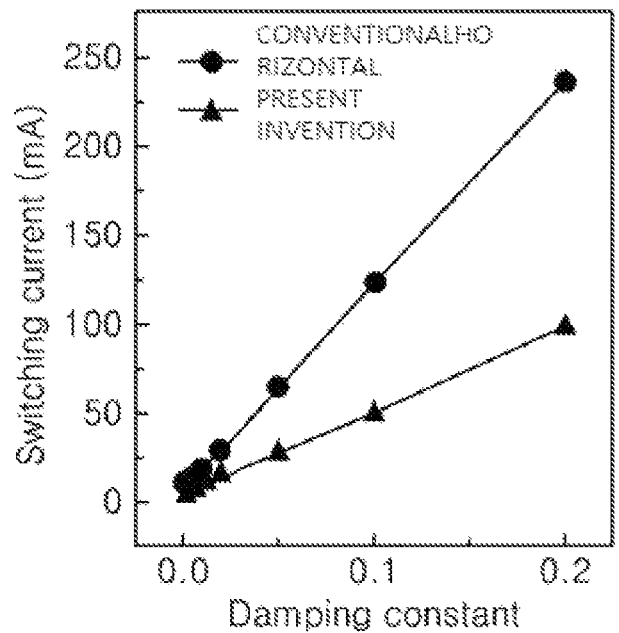
[FIG. 30]
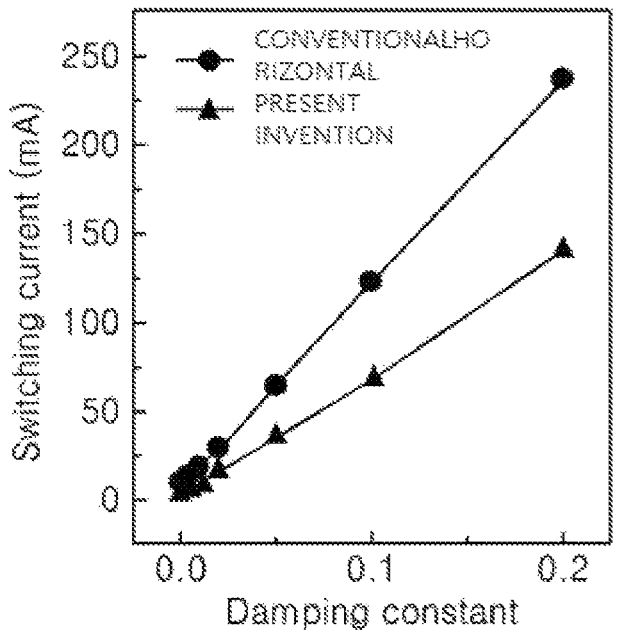

【FIG. 31】
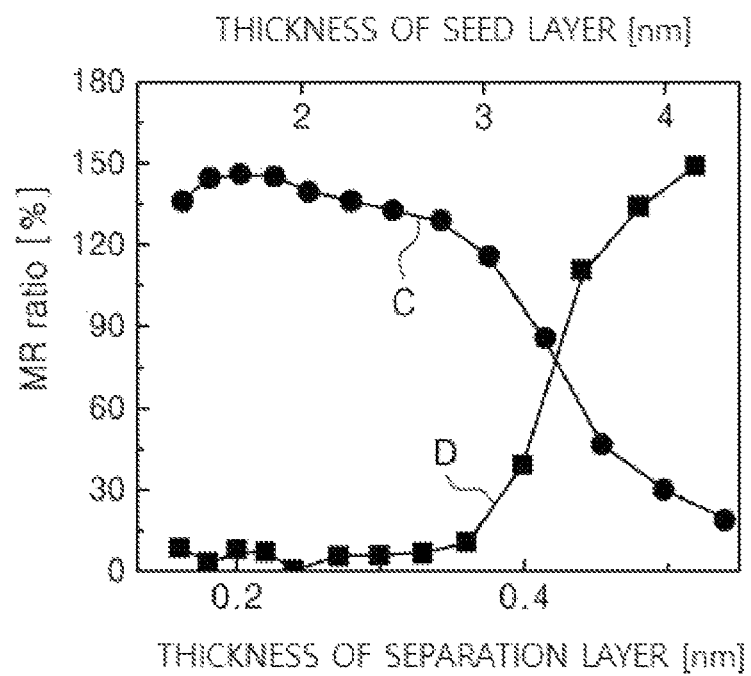

MEMORY DEVICE

TECHNICAL FIELD

The present invention relates to a memory device, more particularly to a magnetic memory device using a Magnetic Tunnel Junction (MTJ).

CROSS-REFERENCE TO RELATED APPLICATIONS

This application claims priority to and the benefit of Korean Patent Application No. 10-2015-0037234, filed on Mar. 18, 2015, Korean Patent Application No. 10-2015-0045174, filed on Mar. 31, 2015, Korean Patent Application No. 10-2015-0037233, filed on Mar. 18, 2015, Korean Patent Application No. 10-2015-0045173, filed on Mar. 31, 2015, Korean Patent Application No. 10-2015-0037232, filed on Mar. 18, 2015, Korean Patent Application No. 10-2015-0045172, filed on Mar. 31, 2015, Korean Patent Application No. 10-2015-0037231, filed on Mar. 18, 2015, Korean Patent Application No. 10-2015-0045171, filed on Mar. 31, 2015, and Korean Patent Application No. 10-2015-0037230, filed on Mar. 18, 2015. Each of the above applications is hereby expressly incorporated by reference, in its entirety, into the present application.

BACKGROUND ART

Research into next-generation nonvolatile memory devices having lower power consumption and higher integration compared to a flash memory device is underway. As examples of such next-generation nonvolatile memory devices, there are phase change memory (PRAM) using phase change in a phase change material such as a chalcogenide alloy, Magnetic RAM (MRAM) using resistance change of a Magnetic Tunnel Junction (MTJ) dependent upon magnetization state of a ferromagnetic material, ferroelectric RAM using polarization of a ferroelectric material, resistive RAM (ReRAM) using resistance change of a variable resistance material, and the like.

As an example of a magnetic memory, there is a Spin-Transfer Torque Magnetic Random Access Memory (STT-MRAM) device capable of inverting magnetization using Spin-Transfer Torque (STT) due to electron injection and discriminating a resistance difference between before and after the magnetization inversion. Such an STT-MRAM device includes a pinned layer and a free layer, each of which is formed of a ferromagnetic material, and an MTJ formed with a tunnel barrier therebetween. This MTJ has a low resistance state due to easy current flow when the magnetization directions of a free layer and a pinned layer are the same (i.e., parallel). On the other hand, when the magnetization directions are different (i.e., anti-parallel), a high resistance state is exhibited due to current decrease. In addition, since a magnetization direction of an MTJ should change only in a direction perpendicular to a substrate, a free layer and a pinned layer should have a perpendicular magnetization value. When a perpendicular magnetization value is symmetrical with respect to 0 according to the intensity and direction of the magnetic field and clear squareness (S) is exhibited (S=1), Perpendicular Magnetic Anisotropy (PMA) may be considered superior. Such an STT-MRAM device is theoretically capable of $10^{15}$ cycles or more and is capable of switching at a rate as high as nanoseconds (ns). In particular, a perpendicular magnetization type STT-MRAM device does not have a scaling limit in theory and has an advantage in that driving current density may be lowered as scaling progresses. Accordingly, research into such a perpendicular magnetization type STT-MRAM device, as a next generation memory device capable of substituting for a DRAM device, is actively underway. Meanwhile, an example of such an STT-MRAM device has been proposed in Korean Patent No. 10-1040163.

In addition, with regard to an STT-MRAM device, a seed layer is formed on a lower part of a free layer, a capping layer is formed on an upper part of a pinned layer, and a synthethic antiferromagnetic (SyAF) layer and an upper electrode are formed on an upper part of a capping layer. In addition, with regard to the STT-MRAM device, a silicon oxide film is formed on a silicon substrate, and then a seed layer and an MTJ are formed on an upper part thereof. In addition, a selection device, such as a transistor, may be formed on the silicon substrate, and a silicon oxide film may be formed to cover the selection device. Accordingly, the STT-MRAM device has a laminated structure including a silicon oxide film formed on a silicon substrate including a selection device thereon; a seed layer; a free layer; a tunnel barrier; a pinned layer; a capping layer; a synthetic antiferromagnetic layer; and an upper electrode. Here, the seed layer and the capping layer are formed using tantalum (Ta), and the synthetic antiferromagnetic layer has a structure wherein a lower magnetic layer, an upper magnetic layer, and a non-magnetic layer formed therebetween are included, i.e., magnetic metals and a non-magnetic metal are alternately laminated.

Currently reported MTJs are based on a $SiO_2$ or MgO substrate, and do not include a lower electrode or mainly have a structure with a Ta/Ru lower electrode. To realize an STT-MRAM device, a capacitor having a 1T1C structure of a conventional DRAM should be replaced with an MTJ. Here, a lower electrode should be formed using a material capable of preventing resistance decrease in the transistor and diffusion of a metal. However, in the case of a conventional MTJ manufactured using a $SiO_2$ or MgO substrate, it is impossible to apply the same to memory fabrication when considering coupling with an actual cell transistor.

In addition, in the case of a synthetic antiferromagnetic layer, a structure wherein a multilayered first magnetic layer, a non-magnetic layer, and a multilayered second magnetic layer are laminated is mainly used. Since each of the first and second magnetic layers is formed in a multilayered structure, the thickness of a fabricated memory device increases. In addition, since the first and second magnetic layers are generally made of a rare-earth metal, process costs thereof are high.

In addition, in a heat treatment process performed at 400° C. for a subsequent process of an MTJ of an STT-MRAM, a material of a synthetic antiferromagnetic layer is diffused into a tunnel barrier of the MTJ, whereby a bcc (100) crystalline structure may be deteriorated. Accordingly, a magnetization direction of the MTJ might not be rapidly changed, whereby operation speed of a memory may be decreased or the memory might not operate.

In addition, since a synthetic antiferromagnetic layer having an fcc (111) structure is formed on an upper part of an MTJ textured to a bcc (100) structure, the fcc (111) structure is diffused into the MTJ when the synthetic antiferromagnetic layer is formed, whereby the bcc (100) crystalline structure may be deteriorated. That is, when the synthetic antiferromagnetic layer is formed, a portion of the synthetic antiferromagnetic layer is diffused into the MTJ, whereby the crystallinity of the MTJ may be deteriorated. Accordingly, since a magnetization direction of the MTJ might not be rapidly changed, operation speed of a memory may be decreased or the memory might not operate.

In addition, a seed layer formed on an upper part of an amorphous silicon oxide film is formed of an amorphous material, whereby an MTJ is also formed of an amorphous material. Accordingly, crystallinity of the MTJ is deteriorated. That is, each of a pinned layer and a free layer is formed of amorphous CoFeB, whereby the crystallinity of the MTJ is not greatly improved although heat treatment is carried out to induce perpendicular anisotropy. When the crystallinity of the MTJ is low, PMA is decreased. Accordingly, although a magnetic field is applied to change a magnetization direction, the magnetization direction is not rapidly changed and the amount of current flowing in a parallel state is reduced. Accordingly, read/write time may be delayed, whereby it may be difficult to realize a high-speed memory device and read/write operation errors may occur.

To address the problems of CoFeB, CoFeAl or CoFeAlSi, a full-Heusler semimetal-based magnetic layer having superior characteristics to CoFeB may be applied to a pinned layer and a free layer. A spin polarization ratio of a CoFeB magnetic substance is theoretically 0.65, but a spin polarization ratio of CoFeAl or CoFeAlSi is 1. Accordingly, in the case of an MTJ using CoFeAl or CoFeAlSi, an infinite Tunneling Magneto-Resistance (TMR) ratio may be anticipated. In addition, since a damping coefficient of CoFeAl or CoFeAlSi is 0.001 although a damping coefficient of CoFeB is 0.005, consumption of switching current capable of changing an electron spin direction of a free layer is small.

However, when Ta is used as a seed layer, CoFeAl or CoFeAlSi does not exhibit perpendicular anisotropy. That is, since CoFeAl and CoFeAlSi are non-amorphous and crystalline, it is difficult to texturize CoFeAl or CoFeAlSi and MgO to a bcc (100) structure due to self-crystallization of an MgO tunnel barrier. In addition, to texturize CoFeAl or CoFeAlSi to a bcc (100) structure, a seed layer should be formed of Cr or Ru and a heat treatment process should be carried out at a high temperature of 700° C. or more.

Meanwhile, a metal line formation process and passivation process, which should be carried out after forming a synthetic antiferromagnetic layer and un upper electrode, are carried out at about 400° C. By the way, when Ta is used as a seed layer, PMA of an MTJ is deteriorated at about 400° C. Accordingly, thermal stability of PMA of the MTJ should be improved.

Further, to realize an STT-MRAM device, switching energy should be low enough to cope with a DRAM. However, there are difficulties in manufacturing a memory due to high energy used to spin a free layer.

RELATED ART DOCUMENT

Korean Patent No. 10-1040163

DISCLOSURE

Technical Problem

Therefore, the present invention has been made in view of the above problems, and it is one object of the present invention to provide a memory device, the thickness and process unit price of which are reduced.

It is another object of the present invention to provide a memory device, a process unit price and an overall thickness of which are reduced by reducing the thickness of a synthetic antiferromagnetic layer.

It is another object of the present invention to provide a memory device capable of improving crystallinity of an MTJ and thus rapidly changing a magnetization direction.

It is another object of the present invention to provide a memory device capable of improving crystallinity of an MTJ by preventing a material of a synthetic antiferromagnetic layer from diffusing into an MTJ.

It is another object of the present invention to provide a memory device capable of rapidly changing a magnetization direction of an MTJ, thereby increasing the speed of read/write operation.

It is another object of the present invention to provide a memory device capable of improving thermal stability of PMA of an MTJ.

It is another object of the present invention to provide a memory device capable of lowering switching energy of a free layer.

It is yet another object of the present invention to provide a memory device capable of rapidly changing a magnetization direction of an MTJ, thereby increasing operation speed.

Technical Solution

Memory devices according to embodiments of Examples 1 to 3 of the present invention to Example 3 include a substrate and a lower electrode, buffer layer, seed layer, synthetic antiferromagnetic layer, capping layer, Magnetic Tunnel Junction (MTJ), and upper electrode formed on the substrate.

In the memory device according to the embodiment of Example 1 of the present invention, the lower electrode, buffer layer, seed layer, MTJ, capping layer, synthetic antiferromagnetic layer, and upper electrode are laminated on the substrate, and the synthetic antiferromagnetic layer includes a first magnetic layer having a single layer structure, a non-magnetic layer, and a multilayered second magnetic layer.

The lower electrode may be formed of a polycrystalline conductive material.

The memory device according to the embodiment of Example 1 of the present invention may further include a buffer layer that is formed between the lower electrode and the seed layer and is formed of a material including tantalum.

A free layer of the MTJ may include a first magnetization layer having horizontal magnetization; a separation layer having no magnetization; and a second magnetization layer having perpendicular magnetization.

The first and second free layers of the MTJ are formed of a material including CoFeB, and the first free layer may be formed more thickly than the second free layer.

The capping layer is formed of a material having a bcc structure.

The first and second magnetic layers are formed of a material including Pt.

The first magnetic layer may be formed in a single Co/Pt layer structure, and the second magnetic layer may be formed in a multilayered structure including Co/Pt laminated at least twice.

In the memory device according to an embodiment of Example 2 of the present invention, the lower electrode, buffer layer, seed layer, MTJ, capping layer, synthetic antiferromagnetic layer, and upper electrode are laminated on the substrate, and the capping layer is formed of at least two layers.

A first capping layer, which is adjacent to the MTJ, of the capping layer may be formed of a material having a bcc structure, and a second capping layer adjacent to the synthetic antiferromagnetic layer may be formed of a material preventing the synthetic antiferromagnetic layer material from being diffused downwardly.

In the memory device according to the embodiment of Example 3 of the present invention, the lower electrode, buffer layer, seed layer, synthetic antiferromagnetic layer, capping layer, MTJ, and upper electrode are sequentially laminated on the substrate.

The synthetic antiferromagnetic layer may be formed in a structure wherein a first magnetic layer, a non-magnetic layer, and a second magnetic layer are laminated, and the first and second magnetic layers may be formed of a material including Pt.

The first magnetic layer may be formed in a multilayered structure including Co/Pt laminated at least 15 times, and the second magnetic layer is formed in a single Co/Pt layer structure.

A free layer of the MTJ may include a first magnetization layer having perpendicular magnetization; a separation layer having no magnetization; and a second magnetization layer having perpendicular magnetization, wherein the first magnetization layer may be formed adjacent to the pinned layer.

The first and second free layers of the MTJ may be formed of a material including CoFeB, and the first free layer may be formed more thinly than the second free layer.

A memory device according to an embodiment of Example 4 of the present invention includes a substrate and a lower electrode, seed layer, and MTJ laminated on the substrate, wherein the seed layer is formed in at least a dual structure, and at least one layer of the dual structure has a bcc structure.

The lower electrode may be formed in a structure wherein a first lower electrode including tungsten and a second lower electrode including TiN are laminated.

The seed layer may be formed in a structure wherein a first seed layer self-crystallizable to bcc and a second seed layer having a bcc structure are laminated.

The first seed layer may be formed thinly than a tunnel barrier of the MTJ.

The first seed layer may be formed to a thickness of 1 nm to 1.5 nm, and the second seed layer may be formed to a thickness of 1 nm to 1.4 nm.

A memory device according to an embodiment of Example 5 of the present invention includes MTJ that includes a free layer, a tunnel barrier, and a pinned layer, wherein the free layer is formed in at least a two-layer structure having different magnetization directions.

The free layer may be adjacent to the pinned layer and may have perpendicular magnetization.

The free layer may include a first magnetization layer having horizontal magnetization; a separation layer having no magnetization; and a second magnetization layer having perpendicular magnetization.

A first free layer of the free layer may be formed to a thickness of 1 nm to 4 nm, and a second free layer of the free layer may be formed to a thickness of 0.8 nm to 1.2 nm.

Advantageous Effects

An embodiment of Example 1 of the present invention provides 1 transistor and 1 MTJ (1T1M) structure, as a basic structure of an STT-MRAM, using a lower electrode formed of a polycrystalline conductive material. This 1T1M structure may be applied to an actual memory fabrication process.

In addition, by forming a polycrystalline seed layer on the lower electrode, an amorphous MTJ formed on the polycrystalline seed layer is formed in a crystalline structure of the seed layer. In addition, due to subsequent heat treatment, a further improved crystalline structure is provided compared to conventional cases. Accordingly, a magnetization direction of the MTJ may be rapidly changed, whereby operation speed may be increased.

In addition, by forming a synthetic antiferromagnetic layer with a first magnetic layer having a single layer structure, a non-magnetic layer, and a second magnetic layer having a multilayered structure, the thickness of the synthetic antiferromagnetic layer may be reduced, whereby an overall thickness of a memory device may be reduced. Further, since a use amount of a material for forming the synthetic antiferromagnetic layer is reduced, a process unit price may be reduced.

An embodiment of Example 2 of the present invention provides 1 transistor and 1 MTJ (1T1M) structure, as a basic structure of an STT-MRAM, using a lower electrode formed of a polycrystalline conductive material. This 1T1M structure may be applied to an actual memory fabrication process. In addition, by forming a polycrystalline seed layer on the lower electrode, an amorphous MTJ formed on the polycrystalline seed layer is formed in a crystalline structure of the seed layer. In addition, due to subsequent heat treatment, a further improved crystalline structure is provided compared to conventional cases. Accordingly, a magnetization direction of the MTJ may be rapidly changed, whereby operation speed may be increased.

In addition, by forming a capping layer in at least a dual structure between the MTJ and a synthetic antiferromagnetic layer, diffusion of the synthetic antiferromagnetic layer may be prevented and a bcc structure of a pinned layer may be maintained. Accordingly, properties are not deteriorated even after a subsequent heat treatment process. Therefore, a magnetization direction of the MTJ may be rapidly changed, whereby operation speed of a memory may be increased.

In an embodiment of Example 3 of the present invention, a synthetic antiferromagnetic layer is formed on a substrate, and then an MTJ is formed. Accordingly, since a material of a synthetic antiferromagnetic layer is not diffused into an MTJ, a bcc (100) crystal of the MTJ may be preserved. Accordingly, a magnetization direction of the MTJ may be rapidly changed, whereby operation speed of a memory may be increased.

In Example 4 of the present invention, since a seed layer having a structure wherein a first seed layer capable of self-crystallization and a second seed layer having a bcc structure are laminated is formed on a lower electrode having a polycrystalline structure and a free layer and pinned layer are formed of CoFeAl or CoFeAlSi, the perpendicular magnetic characteristics of CoFeAl or CoFeAlSi may be realized. Accordingly, a high TMR ratio may be realized compared to conventional memory devices using CoFeB, and a low-power switching driving current may be realized.

In addition, in Example 4 of the present invention, diffusion of a buffer layer material into an MTJ at about 350° C. may be prevented and the perpendicular magnetic characteristics of CoFeAl or CoFeAlSi may be maintained by using the seed layer having the laminated structure. Accordingly, a subsequent process temperature in fabricating an MTJ may be maintained up to 350° C., thereby ensuring process margin.

In addition, since Example 4 of the present invention does not require a high-temperature heat treatment process for bcc crystallization of the seed layer which is based on CoFeAl or CoFeAlSi, process cost and process time may be reduced. In particular, since the thickness of a second seed layer may be reduced to 2 nm or less due to bcc self-crystallization of a first seed layer, the seed layer may be fabricated very thinly compared to a conventional seed layer having a thickness of about 40 nm.

An embodiment of Example 5 of the present invention provides 1 transistor and 1 MTJ (1T1M) structure, as a basic structure of an STT-MRAM, using a lower electrode formed of a polycrystalline conductive material. This 1T1M structure may be applied to an actual memory fabrication process. In addition, by forming a polycrystalline seed layer on the lower electrode, an amorphous MTJ formed on the polycrystalline seed layer is formed in a crystalline structure of the seed layer. In addition, due to subsequent heat treatment, a further improved crystalline structure is provided compared to conventional cases. Accordingly, a magnetization direction of the MTJ may be rapidly changed, whereby operation speed may be increased.

In addition, since a free layer has a structure wherein a first free layer having horizontal magnetization, a separation layer having no magnetization, and a second free layer having perpendicular magnetization are laminated, the second free layer having perpendicular magnetization magnetically resonates with the first free layer having horizontal magnetization when a spin direction of the second free layer is changed into an opposite perpendicular direction beyond a horizontal direction, whereby switching energy of the free layer may be lowered while maintaining magnetization characteristics and a magneto resistance ratio of the MTJ.

DESCRIPTION OF DRAWINGS

FIG. 1 illustrates a sectional view of a memory device according to an embodiment of Example 1 of the present invention.

FIGS. 2 and 3 respectively illustrate magnetization characteristics of a conventional memory device.

FIGS. 4 and 5 respectively illustrate magnetization characteristics of a memory device of Example 1 of the present invention.

FIG. 6 is graph illustrating a comparison between magneto resistance ratios of a conventional memory device and a memory device of Example 1 of the present invention.

FIGS. 7 and 8 respectively illustrate TEM images of a conventional memory device and a memory device of Example 1 of the present invention.

FIG. 9 illustrates a sectional view of a memory device according to an embodiment of Example 2 of the present invention.

FIGS. 10 and 11 are graphs illustrating temperature-dependent magnetic characteristics of a memory device according to a conventional example.

FIGS. 12 and 13 are graphs illustrating temperature-dependent magnetic characteristics of a memory device according to Example 2 of the present invention.

FIG. 14 illustrates a sectional view of a memory device according to an embodiment of Example 3 of the present invention.

FIGS. 15 to 18 are graphs illustrating perpendicular magnetic characteristics of memory devices according to a conventional example and Example 3 of the present invention.

FIG. 19 illustrates a sectional view of a memory device according to an embodiment of Example 4 of the present invention.

FIGS. 20 to 22 are graphs illustrating perpendicular magnetic characteristics in comparative examples.

FIG. 23 is a graph illustrating perpendicular magnetic characteristics in an embodiment of Example 4 of the present invention.

FIG. 24 illustrates a sectional view of a memory device according to an embodiment of Example 5 of the present invention.

FIGS. 25 and 26 are drawings illustrating magnetic characteristics of a conventional memory device.

FIGS. 27 and 28 are drawings illustrating magnetic characteristics of the memory device according to Example 5 of the present invention.

FIGS. 29 and 30 are drawings illustrating switching current characteristics of a conventional memory device and the memory device according to Example 5 of the present invention.

FIG. 31 is a drawing illustrating magneto resistance ratios of a conventional memory device and the memory device according to Example 5 of the present invention.

BEST MODE

Hereinafter, embodiments of the present invention are described in detail with reference to the accompanying drawings. However, the present disclosure may be embodied in many different forms and should not be construed as limited to the embodiments set forth herein. Rather, these embodiments are provided so that this disclosure will be thorough and complete, and will fully convey the scope of the disclosure to those skilled in the art.

Memory devices according to Examples 1 to 5 of the present invention may include identical constituents. These identical constituents are described with regard to the memory device according to Example 1 of the present invention.

Hereinafter, the memory device according to an embodiment of Example 1 of the present invention is described with reference to FIGS. 1 to 8.

FIG. 1 illustrates a sectional view of a memory device according to an embodiment of Example 1 of the present invention, particularly a sectional view of an STT-MRAM device.

Referring to FIG. 1, the memory device according to an embodiment of Example 1 of the present invention includes a substrate 100 and a lower electrode 110, a buffer layer 120, a seed layer 130, a free layer 140, a tunnel barrier 150, a pinned layer 160, a capping layer 170, a synthetic antiferromagnetic layer 180, and an upper electrode 190 formed on the substrate 100. Here, the free layer 140, the tunnel barrier 150, and the pinned layer 160 constitute an MTJ. In addition, the synthetic antiferromagnetic layer 180 includes a first magnetic layer 181, a diamagnetic layer 182, and a second magnetic layer 183. Here, the first magnetic layer 181 is formed in a single layer structure, and the second magnetic layer 183 is formed in a multilayered structure.

The substrate 100 may be a semiconductor substrate. For example, the substrate 100 may be a silicon substrate, a gallium arsenide substrate, a silicon germanium substrate, a silicon oxide film substrate, or the like. In this embodiment, a silicon substrate is used. In addition, a selection device including a transistor may be formed on the substrate 100. An insulating layer 105 may be formed on the substrate 100. That is, the insulating layer 105 may be formed to cover a predetermined structure of the selection device, and the insulating layer 105 may include a contact hole configured to expose at least a portion of the selection device. The insulating layer 105 may be formed using a silicon oxide film ($SiO_2$) having an amorphous structure, or the like.

The lower electrode 110 is formed on the insulating layer 105. The lower electrode 110 may be formed using a conductive material such as a metal or a metal nitride. In addition, the lower electrode 110 of Example 1 of the present invention may be formed in at least one layer structure. Here, the lower electrode 110 may be formed on the insulating layer 105 or inside the insulating layer 105. The lower electrode 110 may be formed inside or on the insulating layer 105, thereby being connected to the selection device formed on the substrate 100. The lower electrode 110 may be formed of a polycrystalline material. That is, the lower electrode 110 may be formed of a conductive material having a bcc structure. For example, the lower electrode 110 may be formed of a metal nitride such as titanium nitride (TiN). Of course, the lower electrode 110 may be formed in at least a two-layer structure including titanium nitride. For example, the lower electrode 110 may be formed in a structure wherein a metal, such as tungsten (W), and a metal nitride, such as titanium nitride, are laminated. That is, when the lower electrode 110 is formed in at least a dual structure, tungsten may be formed on the insulating layer 105 and titanium nitride may be formed on the tungsten.

The buffer layer 120 is formed on the lower electrode 110. The buffer layer 120 is provided to address lattice constant mismatch between the lower electrode 110 and the seed layer 130. To accomplish this, the buffer layer 120 may be formed of a material having superior match to the lower electrode 110. For example, when the lower electrode 110 is formed of TiN, the buffer layer 120 may be formed using tantalum (Ta) having superior lattice match to TiN. Here, since the lower electrode 110 is polycrystalline although Ta is amorphous, the amorphous buffer layer 120 may grow in a crystal direction of the polycrystalline lower electrode 110, and crystallinity may be improved due to subsequent heat treatment. Meanwhile, the buffer layer 120 may be formed, for example, to a thickness of 2 nm to 10 nm, preferably a thickness of 5 nm.

The seed layer 130 is formed on the buffer layer 120. The seed layer 130 is formed of a polycrystalline material, e.g., a conductive material having a bcc structure. For example, the seed layer 130 may be formed of tungsten (W). By forming the seed layer 130 with a polycrystalline material, the crystallinity of the MTJ including the free layer 140, tunnel barrier 150, and pinned layer 160 formed on the seed layer 130 may be improved. That is, when the seed layer 130 is formed in a bcc structure, the amorphous MTJ on the seed layer 130 grows in a crystal direction of the seed layer 130 and, when a subsequent heat treatment process is carried out for PMA, the crystallinity of the MTJ may be improved compared to conventional cases. In particular, when W is used in the seed layer 130, crystallization occurs after heat treatment at high temperature such as 400° C. or more, for example 400° C. to 500° C., whereby diffusion of a capping layer material, a synthetic antiferromagnetic layer material, and the like into the tunnel barrier 150 may be prevented and PMA of the MTJ may be maintained by crystallizing the free layer 140 and the pinned layer 160. That is, in a conventional case in which an amorphous seed layer and an amorphous MTJ are formed on an amorphous insulating layer, the crystallinity of an MTJ is not improved although heat treatment is carried out. By the way, when the crystallinity of the MTJ is improved according to the present invention, magnetization further greatly occurs upon application of a magnetic field, and the amount of a current flowing through the MTJ in a parallel state further increases. Accordingly, when the MTJ is applied to a memory device, operation speed and reliability of the memory device may be improved. Meanwhile, the seed layer 130 may be formed, for example, to a thickness of 1 nm to 3 nm.

The free layer 140 is formed on the seed layer 130 and is formed of a ferromagnetic material. Magnetization of the free layer 140 is not fixed to one direction and may be changed from one direction to an opposite direction. That is, a magnetization direction of the free layer 140 may be the same as the pinned layer 160 (i.e., parallel) or may be opposite thereto (i.e., anti-parallel). The MTJ may be utilized as a memory device by corresponding information of "0" or "1" to a resistance value that changes according to magnetization arrangement of the free layer 140 and the pinned layer 160. For example, when a magnetization direction of the free layer 140 is parallel to that of the pinned layer 160, a resistance value of the MTJ is decreased. This case may be defined as data "0". In addition, when the magnetization direction of the free layer 140 is anti-parallel to that of the pinned layer 160, a resistance value of the MTJ increases. This case may be defined as data "1." The free layer 140 may be formed using, for example, a ferromagnetic material such as a multilayered thin film wherein a full-Heusler semimetal-based alloy, an amorphous rare-earth element alloy, a magnetic metal (ferromagnetic metal), and a non-magnetic metal are alternately laminated, an alloy having an L10-type crystalline structure, or a cobalt-based alloy. An example of the full-Heusler semimetal-based alloy includes CoFeAl, CoFeAlSi, and the like, and an example of the amorphous rare-earth element alloy includes alloys such as TbFe, TbCo, TbFeCo, DyTbFeCo, and GdTbCo. In addition, an example of the multilayered thin film wherein a non-magnetic metal and a magnetic metal are alternately laminated includes Co/Pt, Co/Pd, CoCr/Pt, Co/Ru, Co/Os, Co/Au, Ni/Cu, CoFeAl/Pd, CoFeAl/Pt, CoFeB/Pd, CoFeB/Pt, and the like. In addition, an example of the alloy having an L10-type crystalline structure includes Fe50Pt50, Fe50Pd50, Co50Pt50, Fe30Ni20Pt50, Co30Ni20Pt50, and the like. In addition, an example of the cobalt-based alloy includes CoCr, CoPt, CoCrPt, CoCrTa, CoCrPtTa, CoCrNb, CoFeB, and the like. A single layer formed of CoFeB thereamong may be thickly formed compared to a multilayered structure including CoFeB and Co/Pt or Co/Pd, whereby a magneto resistance ratio may be increased. In addition, since CoFeB may be easily etched compared to a metal such as Pt or Pd, a CoFeB single layer may be easily fabricated compared to a multilayered structure containing Pt, Pd, or the like. Accordingly, in an embodiment of Example 1 of the present invention, the free layer 140 is formed using a CoFeB single layer and CoFeB is formed in an amorphous state, followed by being textured into a bcc (100) structure by heat treatment. Meanwhile, the free layer 140 may be formed in a structure in which a first free layer, a separation layer, and a second free layer are laminated. Here, the first and second free layers may have magnetization in the same direction or in different directions. For example, the first and second free layers may respectively have perpendicular magnetization, or the first free layer may have horizontal magnetization and the second free layer may have perpendicular magnetization. In addition, the separation layer may be formed of a material having a bcc structure. When the first free layer has horizontal magnetization, the second free layer has perpendicular magnetization, and the separation layer is disposed between the first and second free layers, switching energy may be reduced through magnetic resonance of the first and second free layers. That is, when a spin direction of the second free layer having perpendicular magnetization is changed into an opposite perpendicular direction beyond a horizontal direction, switching energy of the free layer 140 may be lowered by making magnetic resonance with the first free layer having horizontal magnetization. Here, the first and second free layers are respectively formed of CoFeB, and the first free layer is formed more thickly than the second free layer. For example, the first free layer may be formed to a thickness of 1 nm to 4 nm using CoFeB, the second free layer may be formed to a thickness of 0.8 nm to 1.2 nm using CoFeB, and the separation layer may be formed to a thickness of 0.4 nm to 2 nm using a material having a bcc structure.

The tunnel barrier 150 is formed on the free layer 140, thereby separating the free layer 140 from the pinned layer 160. The tunnel barrier 150 allows quantum mechanical tunneling between the free layer 140 and the pinned layer 160. The tunnel barrier 150 may be formed of magnesium oxide (MgO), aluminum oxide ($Al_2O_3$), silicon oxide ($SiO_2$), tantalum oxide ($Ta_2O_5$), silicon nitride (SiNx), aluminum nitride (AlNx), or the like. In the embodiment of Example 1 of the present invention, the tunnel barrier 150 is formed of polycrystalline magnesium oxide. The magnesium oxide is textured into a bcc (100) structure due to subsequent heat treatment.

The pinned layer 160 is formed on the tunnel barrier 150. Magnetization of the pinned layer 160 is fixed into one direction within a predetermined magnetic field range, and may be formed of a ferromagnetic material. For example, magnetization may be fixed in a direction from the top to the bottom. The pinned layer 160, may be formed using, for example, a ferromagnetic material such as a multilayered thin film wherein a full-Heusler semimetal-based alloy, an amorphous rare-earth element alloy, a magnetic metal (ferromagnetic metal), and a non-magnetic metal are alternately laminated, an alloy having an L10-type crystalline structure, or a cobalt-based alloy. Here, the pinned layer 160 may be formed of the same ferromagnetic material as the free layer 140, and may be a CoFeB single layer. CoFeB is formed in an amorphous state, and then textured in a BCC (100) structure due to heat treatment.

The capping layer 170 is formed on the pinned layer 160, thereby magnetically separating the pinned layer 160 and the synthetic antiferromagnetic layer 180 from each other. Due to formation of the capping layer 170, magnetization of the synthetic antiferromagnetic layer 180 and the pinned layer 160 each independently occurs. In addition, the capping layer 170 may be formed considering magneto resistance ratios of the free layer 140 and the pinned layer 160 for operation of the MTJ. The capping layer 170 may be formed of a material allowing crystal growth of the synthetic antiferromagnetic layer 180. That is, the capping layer 170 allows first and second magnetic layers 181 and 183 of the synthetic antiferromagnetic layer 180 to grow in a crystal direction. For example, the capping layer 170 may be formed of a metal facilitating crystal growth in a Face Centered Cubic (FCC) (111) direction or a Hexagonal Close-Packed (HCP) structure (001) direction. The capping layer 170 may include a metal selected from the group consisting of tantalum (Ta), ruthenium (Ru), titanium (Ti), palladium (Pd), platinum (Pt), magnesium (Mg), cobalt (Co), aluminum (Al), and tungsten (W), or an alloy thereof. Preferably, the capping layer 170 may be formed of at least any one of tantalum (Ta) and tungsten (W). That is, the capping layer 170 may be formed of tantalum (Ta) or tungsten (W) and may be formed in a laminated Ta/W structure. Meanwhile, the capping layer 170 may be formed to a thickness of 0.3 nm to 0.6 nm. When Ta is used, the capping layer 170 may be formed to a thickness of 0.4 nm to 0.6 nm and, when W is used, the capping layer 170 may be formed to a thickness of 0.35 nm to 0.55 nm. Here, although the pinned layer 160 and the first magnetic layer 181 of the synthetic antiferromagnetic layer 180 should be ferro-coupled to fix a magnetization direction of the pinned layer 160, the magnetization direction of the pinned layer 160 is not fixed and has the same magnetization direction as the free layer 140 due to an increased thickness of the capping layer 170 when the capping layer 170 formed using W is formed to a thickness of 0.55 nm or more. Accordingly, the same magnetization direction and different magnetization directions required in an MRAM device do not occur, whereby the MTJ does not operate as a memory.

The synthetic antiferromagnetic layer 180 is formed on the capping layer 170, thereby fixing magnetization of the pinned layer 160. The synthetic antiferromagnetic layer 180 includes the first magnetic layer 181, a non-magnetic layer 182, and the second magnetic layer 183. That is, in the synthetic antiferromagnetic layer 180, the first and second magnetic layers 181 and 183 are antiferromagnetically coupled to each other via the non-magnetic layer 182. Here, magnetization directions the first and second magnetic layers 181 and 183 are arranged in anti-parallel. For example, the first magnetic layer 181 may be magnetized in an upper direction (i.e., toward the upper electrode 190), and the second magnetic layer 183 may be magnetized in a lower direction (i.e., toward the MTJ). The first and second magnetic layers 181 and 183 may be formed of a magnetic metal and a non-magnetic metal. As the magnetic metal, a single metal selected from the group consisting of iron (Fe), cobalt (Co), nickel (Ni), and the like, or an alloy thereof may be used. As the non-magnetic metal, a single metal selected from the group consisting of chromium (Cr), platinum (Pt), palladium (Pd), iridium (Ir), rhodium (Rh), ruthenium (Ru), osmium (Os), rhenium (Re), gold (Au), and copper (Cu), or an alloy thereof may be used. For example, the first magnetic layer 181 may be formed of Co/Pd, Co/Pt or CoFe/Pt, and the second magnetic layer 183 may be formed of [Co/Pd]n, [Co/Pt]n or [CoFe/Pt]n, wherein n is an integer of 2 or more. That is, the first magnetic layer 181 may have only a singly laminated structure wherein a magnetic metal and a non-magnetic metal are laminated once, and the second magnetic layer 183 may have a structure wherein a magnetic metal and a non-magnetic metal are laminated several times. In addition, the non-magnetic layer 182 is formed between the first magnetic layer 181 and the second magnetic layer 183, and is formed of a non-magnetic material that allows half-magnetic coupling between the first and second magnetic layers 181 and 183. The non-magnetic layer 182 may be formed of a single metal selected from the group consisting of cobalt (Co), ruthenium (Ru), rhodium (Rh), osmium (Os), rhenium (Re), and chromium (Cr), or alloy thereof, or may be formed in a laminated structure including the same. For example, the non-magnetic layer 182 may be formed in a laminated Co/Ru/Co structure. Since the first magnetic layer 181 is formed in a singly laminated structure, i.e., in a single layer structure as described above, the thickness of the second magnetic layer 183 may also be reduced. Accordingly, an overall thickness of a memory device may be reduced. That is, with respect to the non-magnetic layer 182, a magnetization value of the second magnetic layer 183 should be the same as the sum of magnetization values of the first magnetic layer 181 and the pinned layer 160. By the way, conventionally, the first magnetic layer 181 has been formed to have a plurality of laminated structures, and the second magnetic layer 183 has been formed to have more laminated structures than the first magnetic layer 181 such that the sum of magnetization values of the first magnetic layer 181 and the pinned layer 160 is the same as that of the second magnetic layer 183. For example, conventionally, the multilayered first magnetic layer 181 has been formed to a thickness of 4 nm, the non-magnetic layer 182 has been formed to a thickness of 2.45 nm, and the second magnetic layer 183 has been formed to a thickness of 4.8 nm. However, since the first magnetic layer 181 is formed in a single structure in the present invention, a lamination frequency of the second magnetic layer 183 may be may be reduced compared to conventional cases. Accordingly, an overall thickness of a memory device may be reduced. For example, in the present invention, the first magnetic layer 181 having a single layer structure may be formed to a thickness of 2.4 nm, the non-magnetic layer 182 may be formed to a thickness of 2.45 nm, and the second magnetic layer 183 may be formed to a thickness of 2.1 nm.

The upper electrode 190 is formed on the synthetic antiferromagnetic layer 180. The upper electrode 190 may be formed using a conductive material such as a metal, a metal oxide, or a metal nitride. For example, the upper electrode 190 may be formed of a single metal selected from the group consisting of tantalum (Ta), ruthenium (Ru), titanium (Ti), palladium (Pd), platinum (Pt), magnesium (Mg), and aluminum (Al), or an alloy thereof.

As described above, since the lower electrode 110 of the memory device according to the embodiment of Example 1 of the present invention is formed using a polycrystalline conductive material, e.g., TiN, it is possible to apply 1T1M, as a basic structure of an STT-MRAM, to an actual memory fabrication process. In addition, since the synthetic antiferromagnetic layer 180 fixing magnetization of the pinned layer 160 of the MTJ is formed with the first magnetic layer 181 having a single layer structure, the non-magnetic layer 182, and the multilayered second magnetic layer 183, the thickness of the synthetic antiferromagnetic layer 180 is reduced, whereby an overall thickness of a memory device may be reduced. Accordingly, time may be shortened in a subsequent etching process and the like. In addition, since a width and length ratio of the memory device after etching is lowered, a stable process may be accomplished. Further, a use amount of a rare-earth material or the like used to form the synthetic antiferromagnetic layer 180 is reduced, whereby a process unit price may be reduced.

Comparison of Conventional Example and Example According to the Present Invention FIGS. 2 to 5 respectively illustrate magnetization characteristics of a memory device having a conventional structure and the memory device according to the present invention structure. That is, FIGS. 2 and 3 respectively illustrate magnetization characteristics of a conventional memory device and magnetization characteristics of a free layer included therein, and FIGS. 4 and 5 respectively illustrate magnetization characteristics of the memory device of Example 1 of the present invention and magnetization characteristics of a free layer included therein. In addition, FIG. 3 is an enlarged view of portion A of FIG. 2, FIG. 5 is an enlarged view of portion B of FIG. 4. In a synthetic antiferromagnetic layer of the conventional memory device, a first magnetic layer was formed to a thickness of 4.0 nm by laminating Co/Pt five times, a non-magnetic layer was formed to a thickness of 2.45 nm by laminating Co/Ru/Co/Pt, and a second magnetic layer was formed to a thickness of 4.8 nm by laminating Co/Pt six times. On the other hand, in the synthetic antiferromagnetic layer of the memory device of Example 1 of the present invention, the first magnetic layer was formed to a thickness of 2.4 nm by laminating Co/Pt once, the non-magnetic layer was formed to a thickness of 2.45 nm by laminating Co/Ru/Co, and the second magnetic layer was formed to a thickness of 2.1 nm by laminating Co/Pt three times.

As illustrated in FIGS. 2 and 4, square boxes indicate a free layer, a pinned layer, a first magnetic layer, and a second magnetic layer in order from the bottom of the square boxes. From these drawings, it can be confirmed that the free layer, the pinned layer, the first magnetic layer, and the second magnetic layer have satisfactory perpendicular magnetization and magnetization thereof is normally changed. In addition, as illustrated in FIGS. 3 and 5, it can be confirmed that the free layer satisfactorily maintains coercivity and squareness. That is, both the conventional case in which the first magnetic layer of the synthetic antiferromagnetic layer is formed in a multilayered structure and the case of Example 1 of the present invention in which the first magnetic layer is formed in a single layer structure, magnetization may normally change. However, it can be confirmed that, in Example 1 of the present invention, Hex, as a force for fixing the pinned layer, is reduced to 1.4 kOe, compared to 2.2 kOe of the conventional example, but the pinned layer is sufficiently fixed.

FIG. 6 illustrates graphs comparing magneto resistance ratios of the conventional memory device and the memory device of Example 1 of the present invention in a subsequent heat treatment process performed at 300° C. Magnetoresistance ratios thereof dependent upon the thicknesses of capping layers were compared. That is, magneto resistance ratios were measured while adjusting the thickness of the capping layers of the conventional memory device and the memory device of Example 1 of the present invention of FIGS. 2 to 5. As illustrated in FIG. 6, it can be confirmed that, in both the conventional memory device and the memory device of Example 1 of the present invention, a magneto resistance ratio increases until the thickness of the capping layer is 0.6 nm and then decreases after a thickness of 0.6 nm. In addition, it can be confirmed that maximum values thereof are respectively 159% and 158% which are similar values.

FIGS. 7 and 8 respectively illustrate TEM images of the conventional memory device and the memory device according to Example 1 of the present invention. That is, a Co/Pt structure should have an fcc structure to have perpendicular magnetization. To investigate this, diffraction patterns obtained by analyzing TEM images are illustrated in FIGS. 7 and 8. As illustrated in FIGS. 7 and 8, it can be confirmed that both the conventional memory device and the memory device according to Example 1 of the present invention have an fcc structure. Accordingly, it can be confirmed that both the conventional memory device and the memory device according to Example 1 of the present invention have perpendicular magnetization.

Hereinafter, a memory device according to an embodiment of Example 2 of the present invention is described with reference to FIGS. 9 to 13.

FIG. 9 illustrates a sectional view of a memory device according to an embodiment of Example 2 of the present invention, particularly a sectional view of an STT-MRAM device.

Referring to FIG. 9, the memory device according to an embodiment of Example 2 of the present invention includes a substrate 100 and a lower electrode 110, a buffer layer 120, a seed layer 130, a free layer 140, a tunnel barrier 150, a pinned layer 160, a capping layer 170, a synthetic antiferromagnetic layer 180, and an upper electrode 190 formed on the substrate 100. Here, the free layer 140, the tunnel barrier 150, and the pinned layer 160 constitute an MTJ. Here, the MTJ is constituted of the free layer 140, the tunnel barrier 150, and the pinned layer 160, and the capping layer 170 may include first and second capping layers 172 and 174.

The substrate 100 may be a semiconductor substrate. For example, the substrate 100 may be a silicon substrate, a gallium arsenide substrate, a silicon germanium substrate, a silicon oxide film substrate, or the like. In this embodiment, a silicon substrate is used. In addition, a selection device including a transistor may be formed on the substrate 100. An insulating layer 105 may be formed on the substrate 100. That is, the insulating layer 105 may be formed to cover a predetermined structure of the selection device, and the insulating layer 105 may include a contact hole configured to expose at least a portion of the selection device. The insulating layer 105 may be formed using a silicon oxide film ($SiO_2$) having an amorphous structure, or the like.

The lower electrode 110 is formed on the insulating layer 105. The lower electrode 110 may be formed using a conductive material such as a metal or a metal nitride. In addition, the lower electrode 110 of Example 2 of the present invention may be formed in at least one layer structure. Here, the lower electrode 110 may be formed on the insulating layer 105 or inside the insulating layer 105. The lower electrode 110 may be formed inside or on the insulating layer 105, thereby being connected to the selection device formed on the substrate 100. The lower electrode 110 may be formed of a polycrystalline material. That is, the lower electrode 110 may be formed of a conductive material having a bcc structure. For example, the lower electrode 110 may be formed of a metal nitride such as titanium nitride (TiN). Of course, the lower electrode 110 may be formed in at least a two-layer structure including titanium nitride. For example, the lower electrode 110 may be formed in a structure wherein s a metal, such as tungsten (W), and a metal nitride, such as titanium nitride, are laminated. That is, when the lower electrode 110 is formed in at least a dual structure, tungsten may be formed on the insulating layer 105 and titanium nitride may be formed on the tungsten.

The buffer layer 120 is formed on the lower electrode 110. The buffer layer 120 is formed of a material having superior match to the lower electrode 110 so as to address lattice constant mismatch between the lower electrode 110 and the seed layer 130. For example, when the lower electrode 110 or a second lower electrode is formed of TiN, the buffer layer 120 may be formed using tantalum (Ta) having superior lattice match to TiN. Here, since the lower electrode 110 is polycrystalline although Ta is amorphous, the amorphous buffer layer 120 may grow in a crystal direction of the polycrystalline lower electrode 110, and crystallinity may be improved due to subsequent heat treatment. Meanwhile, the buffer layer 120 may be formed, for example, to a thickness of 2 nm to 10 nm.

The seed layer 130 is formed on the buffer layer 120. The seed layer 130 is formed of a polycrystalline material, e.g., a conductive material having a bcc structure. For example, the seed layer 130 may be formed of tungsten (W). By forming the seed layer 130 with a polycrystalline material, the crystallinity of the MTJ including the free layer 140, tunnel barrier 150, and pinned layer 160 formed on the seed layer 130 may be improved. That is, when the polycrystalline seed layer 130 is formed, the amorphous MTJ on the seed layer 130 grows in a crystal direction of the seed layer 130 and, when a subsequent heat treatment process is carried out for PMA, the crystallinity of the MTJ may be improved compared to conventional cases. In particular, when W is used in the seed layer 130, crystallization occurs after heat treatment at high temperature such as 400° C. or more, for example 400° C. to 500° C., whereby diffusion of a buffer layer material, a capping layer material, or a synthetic antiferromagnetic layer material into the tunnel barrier 150 may be prevented. Further, PMA of the MTJ may be maintained by crystallizing the free layer 140 and the pinned layer 160. That is, since an amorphous seed layer and an amorphous MTJ are formed on an amorphous insulating layer in the conventional case, the crystallinity is not improved although subsequent heat treatment is carried out. By the way, when the crystallinity of the MTJ is improved according to the present invention, magnetization further greatly occurs upon application of a magnetic field, and the amount of a current flowing through the MTJ in a parallel state further increases. Accordingly, when the MTJ is applied to a memory device, operation speed and reliability of the memory device may be improved. Meanwhile, the seed layer 130 may be formed, for example, to a thickness of 1 nm to 3 nm.

The free layer 140 is formed on the seed layer 130 and is formed of a ferromagnetic material. Magnetization of the free layer 140 is not fixed to one direction and may be changed from one direction to an opposite direction. That is, a magnetization direction of the free layer 140 may be the same as the pinned layer 160 (i.e., parallel) or may be opposite thereto (i.e., anti-parallel). The MTJ may be utilized as a memory device by corresponding information of "0" or "1" to a resistance value that changes according to magnetization arrangement of the free layer 140 and the pinned layer 160. For example, when a magnetization direction of the free layer 140 is parallel to that of the pinned layer 160, a resistance value of the MTJ is decreased. This case may be defined as data "0". In addition, when the magnetization direction of the free layer 140 is anti-parallel to that of the pinned layer 160, a resistance value of the MTJ increases. This case may be defined as data "1." The free layer 140 may be formed using, for example, a ferromagnetic material such as a multilayered thin film wherein a full-Heusler semimetal-based alloy, an amorphous rare-earth element alloy, a magnetic metal (ferromagnetic metal), and a non-magnetic metal are alternately laminated, an alloy having an L10-type crystalline structure, or a cobalt-based alloy. An example of the full-Heusler semimetal-based alloy includes CoFeAl, CoFeAlSi, and the like, and an example of the amorphous rare-earth element alloy includes alloys such as TbFe, TbCo, TbFeCo, DyTbFeCo, and GdTbCo. In addition, an example of the multilayered thin film wherein a non-magnetic metal and a magnetic metal are alternately laminated includes Co/Pt, Co/Pd, CoCr/Pt, Co/Ru, Co/Os, Co/Au, Ni/Cu, CoFeAl/Pd, CoFeAl/Pt, CoFeB/Pd, CoFeB/Pt, and the like. In addition, an example of the alloy having an L10-type crystalline structure includes Fe50Pt50, Fe50Pd50, Co50Pt50, Fe30Ni20Pt50, Co30Ni20Pt50, and the like. In addition, an example of the cobalt-based alloy includes CoCr, CoPt, CoCrPt, CoCrTa, CoCrPtTa, CoCrNb, CoFeB, and the like. A single layer formed of CoFeB thereamong may be thickly formed compared to a multilayered structure including CoFeB and Co/Pt or Co/Pd, whereby a magneto resistance ratio may be increased. In addition, since CoFeB may be easily etched compared to a metal such as Pt or Pd, a CoFeB single layer may be easily fabricated compared to a multilayered structure containing Pt, Pd, or the like. Further, CoFeB may have perpendicular magnetization as well as horizontal magnetization due to thickness adjustment. Accordingly, in the embodiment of Example 2 of the present invention, the pinned layer 160 is formed using a CoFeB single layer and CoFeB is formed in an amorphous state, followed by being textured into a BCC (100) structure by heat treatment. Meanwhile, the free layer 140 may be formed in a structure in which a first free layer, a separation layer, and a second free layer are laminated. Here, the first and second free layers may have magnetization in the same direction or in different directions. For example, the first and second free layers may respectively have perpendicular magnetization, or the first free layer may have horizontal magnetization and the second free layer may have perpendicular magnetization. In addition, the separation layer may be formed of a material with a bcc structure not having magnetization. That is, the first free layer may be perpendicularly magnetized, the separation layer might not be magnetized, and the second free layer may be perpendicularly or horizontally magnetized. When the first free layer has horizontal magnetization, the second free layer has perpendicular magnetization, and the separation layer is disposed between the first and second free layers like this, switching energy may be reduced through magnetic resonance of the first and second free layers. That is, when a spin direction of the second free layer having perpendicular magnetization is changed into an opposite perpendicular direction beyond a horizontal direction, switching energy of the free layer 140 may be lowered by making magnetic resonance with the first free layer having horizontal magnetization. Here, the first and second free layers are respectively formed of CoFeB, and the first free layer is formed more thickly than the second free layer. For example, the first free layer may be formed to a thickness of 1 nm to 4 nm using CoFeB, the second free layer may be formed to a thickness of 0.8 nm to 1.2 nm using CoFeB, and the separation layer may be formed to a thickness of 0.4 nm to 2 nm using a material having a bcc structure.

The tunnel barrier 150 is formed on the free layer 140, thereby separating the free layer 140 from the pinned layer 160. The tunnel barrier 150 allows quantum mechanical tunneling between the free layer 140 and the pinned layer 160. The tunnel barrier 150 may be formed of magnesium oxide (MgO), aluminum oxide ($Al_2O_3$), silicon oxide ($SiO_2$), tantalum oxide ($Ta_2O_5$), silicon nitride (SiNx), aluminum nitride (AlNx), or the like. In the embodiment of Example 2 of the present invention, the tunnel barrier 150 is formed of polycrystalline magnesium oxide. The magnesium oxide is textured into a bcc (100) structure due to subsequent heat treatment.

The pinned layer 160 is formed on the tunnel barrier 150. Magnetization of the pinned layer 160 is fixed into one direction within a predetermined magnetic field range, and may be formed of a ferromagnetic material. For example, magnetization may be fixed in a direction from the top to the bottom. The pinned layer 160, may be formed using, for example, a ferromagnetic material such as a multilayered thin film wherein a full-Heusler semimetal-based alloy, an amorphous rare-earth element alloy, a magnetic metal (ferromagnetic metal), and a non-magnetic metal are alternately laminated, an alloy having an L10-type crystalline structure, or a cobalt-based alloy. Here, the pinned layer 160 may be formed of the same ferromagnetic material as the free layer 140.

The capping layer 170 is formed on the pinned layer 160, thereby magnetically separating the pinned layer 160 and the synthetic antiferromagnetic layer 180 from each other. Due to formation of the capping layer 170, magnetization of the synthetic antiferromagnetic layer 180 and the pinned layer 160 each independently occurs. In addition, the capping layer 170 may be formed considering magneto resistance ratios of the free layer 140 and the pinned layer 160 for operation of the MTJ. The capping layer 170 may be formed of material that allows the seed layer 130 and the pinned layer 160 and layers therebetween to maintain a crystalline bcc structure, allows crystal growth of the synthetic antiferromagnetic layer 180, and prevents diffusion of a material of the synthetic antiferromagnetic layer 180. That is, the capping layer 170 includes the first capping layer 172 allowing a lower part of the capping layer 170 to maintain a crystalline bcc structure; and the second capping layer 174 allowing the first and second magnetic layers 181 and 183 of the synthetic antiferromagnetic layer 180 to grow in a desired crystal direction and preventing diffusion of a material of the synthetic antiferromagnetic layer 180. Here, the first capping layer 172 may be formed of a conductive material having a bcc structure. For example, the first capping layer 172 may be formed of tungsten (W). In addition, the second capping layer 174 may be formed of a material facilitating crystal growth of the first and second magnetic layers 181 and 183 of the synthetic antiferromagnetic layer 180, for example, in a FCC (111) direction or an HCP structure (001) direction. For example, the second capping layer 174 may include a metal selected from the group consisting of tantalum (Ta), ruthenium (Ru), titanium (Ti), palladium (Pd), platinum (Pt), magnesium (Mg), cobalt (Co), and aluminum (Al), or an alloy thereof. Preferably, tantalum may be used. Meanwhile, the first capping layer 172 may be formed to a thickness of 0.2 nm to 0.5 nm, and the second capping layer 174 may be formed to a thickness of 0.2 nm to 1 nm. Here, although the pinned layer 160 and the first magnetic layer 181 of the synthetic antiferromagnetic layer 180 should be ferrocoupled to fix a magnetization direction of the pinned layer 160, the magnetization direction of the pinned layer 160 is not fixed and has the same magnetization direction as the free layer 140 due to an increased thickness of the capping layer 170 when the second capping layer 174 is formed to a thickness of 1 nm or more. Accordingly, the same magnetization direction and different magnetization directions required in an MRAM device do not occur, whereby the MTJ does not operate as a memory.

The synthetic antiferromagnetic layer 180 is formed on the capping layer 170. The synthetic antiferromagnetic layer 180 is capable of fixing magnetization of the pinned layer 160. The synthetic antiferromagnetic layer 180 includes the first magnetic layer 181, a non-magnetic layer 182, and the second magnetic layer 183. That is, in the synthetic antiferromagnetic layer 180, the first and second magnetic layers 181 and 183 are antiferromagnetically coupled to each other via the non-magnetic layer 182. Here, magnetization directions the first and second magnetic layers 181 and 183 are arranged in anti-parallel. For example, the first magnetic layer 181 may be magnetized in an upper direction (i.e., toward the upper electrode 190), and the second magnetic layer 183 may be magnetized in a lower direction (i.e., toward the MTJ). The first and second magnetic layers 181 and 183 may be formed in a structure wherein a magnetic metal and a non-magnetic metal are alternately laminated. As the magnetic metal, a single metal selected from the group consisting of iron (Fe), cobalt (Co), nickel (Ni), and the like, or an alloy thereof may be used. As the non-magnetic metal, a single metal selected from the group consisting of chromium (Cr), platinum (Pt), palladium (Pd), iridium (Ir), rhodium (Rh), ruthenium (Ru), osmium (Os), rhenium (Re), gold (Au), and copper (Cu), or an alloy thereof may be used. For example, the first magnetic layer 181 and the second magnetic layer 183 may be formed of

[Co/Pd]n, [Co/Pt]n or [CoFe/Pt]n, wherein n is an integer of 1 or more. Here, the second magnetic layer 183 may be formed more thickly than the first magnetic layer 181. In addition, when the first magnetic layer 181 is formed with a plurality of layers, a second buffer layer (not shown) may be formed between the capping layer 170 and the first magnetic layer 181. The second buffer layer is formed so as to address lattice constant mismatch between the capping layer 170 and the first magnetic layer 181. For example, the second buffer layer may be the same material as the first magnetic layer 181. For example, the second buffer layer may be formed in a single layer structure wherein Co and Pt are laminated. In addition, the first magnetic layer 181 may be formed in a single layer structure, and the second magnetic layer 183 may be formed with a plurality of layers. That is, the first magnetic layer 181 may have a singly laminated structure wherein a magnetic metal and a non-magnetic metal are laminated once, and the second magnetic layer 183 may have a structure wherein a magnetic metal and a non-magnetic metal are laminated several times. The non-magnetic layer 182 is formed between the first magnetic layer 181 and the second magnetic layer 183, and is formed of a non-magnetic material that allows half-magnetic coupling between the first and second magnetic layers 181 and 183. For example, the non-magnetic layer 182 may be formed of a single metal selected from the group consisting of ruthenium (Ru), rhodium (Rh), osmium (Os), rhenium (Re) and chromium (Cr), or an alloy thereof.

The upper electrode 190 is formed on the synthetic antiferromagnetic layer 180. The upper electrode 190 may be formed using a conductive material such as a metal, a metal oxide, or a metal nitride. For example, the upper electrode 190 may be formed of a single metal selected from the group consisting of tantalum (Ta), ruthenium (Ru), titanium (Ti), palladium (Pd), platinum (Pt), magnesium (Mg), and aluminum (Al), or an alloy thereof.

As described above, since the lower electrode 110 of the memory device according to the embodiment of Example 2 of the present invention is formed using a polycrystalline conductive material, e.g., TiN, it is possible to apply 1T1M, as a basic structure of an STT-MRAM, to an actual memory fabrication process. In addition, by forming the capping layer 170 between the MTJ and the synthetic antiferromagnetic layer 180 in at least a dual structure and forming the first capping layer 172 at a lower part of the capping layer 170 with a material having a bcc structure, the bcc structure of the MTJ may be maintained. In addition, the second capping layer 174 at an upper part of the capping layer 170 is formed of a material capable of preventing diffusion of a material of the synthetic antiferromagnetic layer 180. Accordingly, even after a subsequent heat treatment process, diffusion of a synthetic antiferromagnetic layer material into the MTJ may be prevented, and thus, the bcc structure of the MTJ may be maintained. Accordingly, the properties of the memory device may be maintained.

Comparison of Conventional Example and Example According to the Present Invention FIGS. 10 and 11 are graphs illustrating magnetization of an MTJ using a conventional single capping layer, and FIGS. 12 and 13 are graphs illustrating magnetization of an MTJ using a dual capping layer of Example 2 of the present invention. In addition, FIGS. 10 and 12 are graphs illustrating magnetization of an MTJ after heat treatment at 350° C., FIGS. 11 and 13 are graphs illustrating magnetization of an MTJ after heat treatment at 400. That is, a SiO$_2$ insulating layer, a TiN lower electrode, a Ta buffer layer, a W seed layer, a CoFeB free layer, a MgO tunnel barrier, and a CoFeB pinned layer are laminated on a silicon substrate. Here, in the conventional case, a bcc capping layer is formed as a single layer and, in Example 2 of the present invention, at least a dual structure including a first bcc capping layer and a second Ta capping layer is formed. In addition, after heat treatment at 350° C. and 400° C., magnetization characteristics of each thereof were determined.

It can be confirmed that a difference between the sum of magnetization degrees of a pinned layer and first magnetic layer and a magnetization degree of a second magnetic layer is 80 uemu after heat treatment at 350° C. as illustrated in FIGS. 10 and 12. That is, it can be confirmed that the sum of magnetization degrees of the pinned layer and first magnetic layer and the magnetization degree of the second magnetic layer are similar to each other after heat treatment at 350° C. However, a difference between the sum of magnetization degrees of the pinned layer and first magnetic layer and a magnetization degree of the second magnetic layer is −30 uemu after heat treatment at 400° C. in the conventional case illustrated in FIG. 11, but it is 60 uemu in the case of the present invention as illustrated in FIG. 13. The magnetization degree differences illustrated in FIGS. 10, 11, 12, and 13 indicate a deterioration degree of magnetization of a pinned layer due to diffusion of a material of a synthetic antiferromagnetic layer. In the conventional case in which a single capping layer is used, a difference between a magnetization degree at 350° C. and a magnetization degree at 400° C. is about 110 uemu, which is similar to the deteriorated magnetization degree of the pinned layer. In addition, in the case of Example 2 of the present invention in which a dual capping layer is used, a difference between a magnetization degree at 350° C. and a magnetization degree at 400° C. is about 20 uemu, which indicates that deterioration is decreased compared to the case in which the single capping layer is used. Accordingly, it can be confirmed that, in the case of Example 2 of the present invention, diffusion of the synthetic antiferromagnetic layer material into the MTJ may be prevented although heat treatment temperature increases, and thus, property deterioration of a memory device may be prevented.

Hereinafter, a memory device according to an embodiment of Example 3 of the present invention is described with reference to FIGS. 14 to 18.

FIG. 14 illustrates a sectional view of a memory device according to an embodiment of Example 3 of the present invention, particularly a sectional view of an STT-MRAM device.

Referring to FIG. 14, the memory device according to an embodiment of Example 3 of the present invention includes a substrate 100 and a lower electrode 110, a first buffer layer 120, a seed layer 130, a synthetic antiferromagnetic layer 140, a capping layer 150, a pinned layer 160, a tunnel barrier 170, a free layer 180, a second buffer layer 190, and an upper electrode 200 formed on the substrate 100. That is, the lower electrode 110 and the upper electrode 200 and layers therebetween are sequentially laminated on the substrate 100. Here, the synthetic antiferromagnetic layer 140 has a structure wherein a first magnetic layer 141, a non-magnetic layer 142 and a second magnetic layer 143 are laminated, and the pinned layer 160, the tunnel barrier 170, and the free layer 180 constitute an MTJ.

The substrate 100 may be a semiconductor substrate. For example, the substrate 100 may be a silicon substrate, a gallium arsenide substrate, a silicon germanium substrate, a silicon oxide film substrate, or the like. In this embodiment, a silicon substrate is used. In addition, a selection device including a transistor may be formed on the substrate 100.

An insulating layer 105 may be formed on the substrate 100. That is, the insulating layer 105 may be formed to cover a predetermined structure of the selection device, and the insulating layer 105 may include a contact hole configured to expose at least a portion of the selection device. The insulating layer 105 may be formed using a silicon oxide film ($SiO_2$) having an amorphous structure, or the like.

The lower electrode 110 is formed on the insulating layer 105. The lower electrode 110 may be formed using a conductive material such as a metal or a metal nitride. In addition, the lower electrode 110 of Example 3 of the present invention may be formed in at least one layer structure. For example, the lower electrode 110 may have at least a dual structure including first and second lower electrodes. Here, the first lower electrode may be formed on the insulating layer 105, and the second lower electrode may be formed on the first lower electrode. In addition, the first lower electrode may be formed inside the insulating layer 105, thereby being connected to a selection device formed on the substrate 100. The lower electrode 110 may be formed of a polycrystalline conductive material. That is, the first and second lower electrodes may be formed of conductive material having a bcc structure. For example, the first lower electrode may be formed of a metal such as tungsten (W), and the second lower electrode may be formed of a metal nitride such as a titanium nitride (TiN) film.

The first buffer layer 120 is formed on the lower electrode 110. The first buffer layer 120 is formed of a material having superior match to the lower electrode 110 so as to address lattice constant mismatch between the lower electrode 110 and the seed layer 130. For example, when the lower electrode 110 or a second lower electrode is formed of TiN, the first buffer layer 120 may be formed using tantalum (Ta) having superior lattice match to TiN. Here, since the lower electrode 110 is polycrystalline although Ta is amorphous, the amorphous first buffer layer 120 may grow in a crystal direction of the polycrystalline lower electrode 110, and crystallinity may be improved due to subsequent heat treatment. Meanwhile, the first buffer layer 120 may be formed, for example, to a thickness of 2 nm to 10 nm.

The seed layer 130 is formed on the first buffer layer 120. The seed layer 130 may be formed of a material allowing crystal growth of the synthetic antiferromagnetic layer 140 crystal. That is, the seed layer 130 allows first and second magnetic layers 141 and 143 of the synthetic antiferromagnetic layer 140 to grow in a crystal direction. For example, the seed layer 130 may be formed of a metal facilitating crystal growth in an FCC (111) direction or an HCP structure (001) direction. The seed layer 130 may include a meal selected from the group consisting of tantalum (Ta), ruthenium (Ru), titanium (Ti), palladium (Pd), platinum (Pt), magnesium (Mg), cobalt (Co), aluminum (Al), and tungsten (W), or an alloy thereof. Preferably, the seed layer 130 may be formed of platinum (Pt) and may be formed to a thickness of 1 nm to 3 nm.

The synthetic antiferromagnetic layer 140 is formed on the seed layer 130. The synthetic antiferromagnetic layer 140 fixes magnetization of the pinned layer 160. The synthetic antiferromagnetic layer 140 includes the first magnetic layer 141, the non-magnetic layer 142, and the second magnetic layer 143. That is, in the synthetic antiferromagnetic layer 140, the first magnetic layer 141 and the second magnetic layer 143 are antiferromagnetically coupled to each other via the non-magnetic layer 142. Here, the first magnetic layer 141 and the second magnetic layer 143 may have a crystal in an FCC (111) or HCP (001) direction. In addition, magnetization directions of the first and second magnetic layers 141 and 143 are arranged in anti-parallel. For example the first magnetic layer 141 may be magnetized in an upper direction (i.e., toward the upper electrode 190), and the second magnetic layer 143 may be magnetized in a lower direction (i.e., the substrate 100 direction). The first magnetic layer 141 and the second magnetic layer 143 may have a structure wherein a magnetic metal and a non-magnetic metal are alternately laminated. A single metal selected from the group consisting of iron (Fe), cobalt (Co), nickel (Ni), and the like, or an alloy thereof may be used as the magnetic metal, and a single metal selected from the group consisting of chromium (Cr), platinum (Pt), palladium (Pd), iridium (Ir), rhodium (Rh), ruthenium (Ru), osmium (Os), rhenium (Re), gold (Au), and copper (Cu), or an alloy thereof may be used as the non-magnetic metal. For example, the first magnetic layer 141 and the second magnetic layer 143 may be formed of [Co/Pd]n, [Co/Pt]n or [CoFe/Pt]n, wherein n is an integer of 1 or more. Here, the first magnetic layer 141 may be formed more thickly than the second magnetic layer 143. In addition, the first magnetic layer 141 may be formed in a structure including a plurality of layers, and the second magnetic layer 143 may be formed in a single layer structure. That is, the first magnetic layer 141 may be formed in a structure wherein a magnetic metal and a non-magnetic metal are laminated several times, and the second magnetic layer 143 may be formed in a structure wherein a magnetic metal and a non-magnetic metal are laminated once, i.e., in a singly laminated structure. The non-magnetic layer 142 is formed between the first magnetic layer 141 and the second magnetic layer 143, and is formed of non-magnetic material allowing half-magnetic coupling between the first magnetic layer 141 and the second magnetic layer 143. For example, the non-magnetic layer 142 may be formed of a single metal selected from the group consisting of ruthenium (Ru), rhodium (Rh), osmium (Os), rhenium (Re), and chromium (Cr), or an alloy thereof. Preferably, the non-magnetic layer 142 may be formed of ruthenium (Ru). Meanwhile, when the second magnetic layer 143 is formed in a singly laminated structure, i.e., a single layer, the thickness of the first magnetic layer 141 may also be reduced, whereby an overall thickness of a memory device may be reduced. That is, with respect to the non-magnetic layer 142, a magnetization value of the first magnetic layer 141 and the sum of magnetization values of the second magnetic layer 143 and pinned layer 160 should be the same. By the way, when the second magnetic layer 143 is formed with a plurality of laminated structures, the first magnetic layer 141 is formed by further repetitively laminating than the second magnetic layer 143 such that the sum of magnetization values of the second magnetic layer 143 and the pinned layer 160 and a magnetization value of the first magnetic layer 141 are the same. However, in the case of the present invention, since the second magnetic layer 143 is formed in a single structure, a lamination frequency of the first magnetic layer 141 may be reduced compared to the conventional case. Accordingly, an overall thickness of a memory device of the present invention may be reduced.

The capping layer 150 is formed on the synthetic antiferromagnetic layer 140. By forming the capping layer 150, magnetization of the synthetic antiferromagnetic layer 140 and the pinned layer 160 each independently occurs. In addition, the capping layer 150 is formed a material capable of improving the crystallinity of the MTJ including the pinned layer 160, the tunnel barrier 170 and the free layer 180. To accomplish this, the capping layer 150 may be formed of a polycrystalline material, e.g., a conductive material having a bcc structure. For example, the capping layer 150 may be formed of tungsten (W). By forming the capping layer 150 with a polycrystalline material, the crystallinity of the MTJ including the pinned layer 160, tunnel barrier 170, and free layer 180 formed on the capping layer 150 may be improved. That is, when the polycrystalline capping layer 150 is formed, the amorphous MTJ formed on the polycrystalline capping layer 150 grows in a crystal direction of the capping layer 150. In addition, when subsequent heat treatment is carried out for PMA, the crystallinity of the MTJ may be improved compared to the conventional case. In particular, when W is used in the capping layer 150, crystallization occurs after heat treatment at a high temperature of 400° C. or more, e.g., 400° C. to 500° C., whereby diffusion of a different material into the tunnel barrier 170 may be prevented. Further, the pinned layer 160 and the free layer 180 are crystallized, whereby PMA of the MTJ may be maintained. That is, when the crystallinity of the MTJ is improved, magnetization further greatly occurs upon application of a magnetic field, and the amount of a current passing through MTJ in a parallel state further increases. Accordingly, when the MTJ is applied to a memory device, operation speed and reliability of the memory device may be improved. Meanwhile, the capping layer 150 may be formed to a thickness of, e.g., 0.4 nm to 0.8 nm. Here, although the second magnetic layer 143 of the synthetic antiferromagnetic layer 140 should be ferro-coupled with the pinned layer 160 so as to fix a magnetization direction of the pinned layer 160, a magnetization direction of the pinned layer 160 is not fixed and the pinned layer 160 has the same magnetization direction as the free layer 180, due to thickness increase in the capping layer 150 when the capping layer 150 formed using W is formed to a thickness of 0.8 nm or more. Accordingly, the same magnetization direction and different magnetization directions necessary in an MRAM device are not provided, whereby the memory device does not operate.

The pinned layer 160 is formed on the seed layer 130 and formed of a ferromagnetic material. Magnetization of the free layer 140 is not fixed to one direction and may be changed from one direction to an opposite direction. That is, a magnetization direction of the free layer 140 may be the same as the pinned layer 160 (i.e., parallel) or may be opposite thereto (i.e., anti-parallel). The MTJ may be utilized as a memory device by corresponding information of "0" or "1" to a resistance value that changes according to magnetization arrangement of the free layer 140 and the pinned layer 160. For example, when a magnetization direction of the free layer 140 is parallel to that of the pinned layer 160, a resistance value of the MTJ is decreased. This case may be defined as data "0". In addition, when the magnetization direction of the free layer 140 is anti-parallel to that of the pinned layer 160, a resistance value of the MTJ increases. This case may be defined as data "1." The free layer 140 may be formed using, for example, a ferromagnetic material such as a multilayered thin film wherein a full-Heusler semimetal-based alloy, an amorphous rare-earth element alloy, a magnetic metal (ferromagnetic metal), and a non-magnetic metal are alternately laminated, an alloy having an L10-type crystalline structure, or a cobalt-based alloy. An example of the full-Heusler semimetal-based alloy includes CoFeAl, CoFeAlSi, and the like, and an example of the amorphous rare-earth element alloy includes alloys such as TbFe, TbCo, TbFeCo, DyTbFeCo, and GdTbCo. In addition, an example of the multilayered thin film wherein a non-magnetic metal and a magnetic metal are alternately laminated includes Co/Pt, Co/Pd, CoCr/Pt, Co/Ru, Co/Os, Co/Au, Ni/Cu, CoFeAl/Pd, CoFeAl/Pt, CoFeB/Pd, CoFeB/Pt, and the like. In addition, an example of the alloy having an L10-type crystalline structure includes Fe50Pt50, Fe50Pd50, Co50Pt50, Fe30Ni20Pt50, Co30Ni20Pt50, and the like. In addition, an example of the cobalt-based alloy includes CoCr, CoPt, CoCrPt, CoCrTa, CoCrPtTa, CoCrNb, CoFeB, and the like. A single layer formed of CoFeB thereamong may be thickly formed compared to a multilayered structure including CoFeB and Co/Pt or Co/Pd, whereby a magneto resistance ratio may be increased. In addition, since CoFeB may be easily etched compared to a metal such as Pt or Pd, a CoFeB single layer may be easily fabricated compared to a multilayered structure containing Pt, Pd, or the like. Further, CoFeB may have perpendicular magnetization as well as horizontal magnetization due to thickness adjustment. Accordingly, in an embodiment of Example 3 of the present invention, the pinned layer 160 is formed using a CoFeB single layer and CoFeB is formed in an amorphous state, followed by being textured in a BCC (100) structure by heat treatment.

The tunnel barrier 170 is formed on the pinned layer 160, thereby separating the pinned layer 160 from the free layer 180. The tunnel barrier 170 allows quantum mechanical tunneling between the pinned layer 160 and the free layer 180. The tunnel barrier 170 may be formed of magnesium oxide (MgO), aluminum oxide ($Al_2O_3$), silicon oxide ($SiO_2$), tantalum oxide ($Ta_2O_5$), silicon nitride (SiNx), aluminum nitride (AlNx), or the like. In the embodiment of Example 3 of the present invention, the tunnel barrier 170 is formed using polycrystalline magnesium oxide. This polycrystalline magnesium oxide is textured into a BCC (100) structure due to subsequent heat treatment.

The free layer 180 is formed on the tunnel barrier 170. Magnetization of the free layer 180 is not fixed into one direction and may change from one direction to an opposite direction. That is, a magnetization direction of the free layer 180 may be the same as the pinned layer 160 (i.e., parallel) or may be opposite thereto (i.e., anti-parallel). The MTJ may be utilized as a memory device by corresponding information of "0" or "1" to a resistance value that changes according to magnetization arrangement of the free layer 180 and the pinned layer 160. For example, when a magnetization direction of the free layer 180 is parallel to that of the pinned layer 160, a resistance value of the MTJ is decreased. This case may be defined as data "0". In addition, when the magnetization direction of the free layer 180 is anti-parallel to that of the pinned layer 160, a resistance value of the MTJ increases. This case may be defined as data "1." The free layer 180 may be formed using, for example, a ferromagnetic material such as a multilayered thin film wherein a full-Heusler semimetal-based alloy, an amorphous rare-earth element alloy, a magnetic metal (ferromagnetic metal), and a non-magnetic metal are alternately laminated, an alloy having an L10-type crystalline structure, or a cobalt-based alloy. Meanwhile, the free layer 180 may be formed in a structure in which a first free layer, a separation layer, and a second free layer are laminated. Here, the first and second free layers may have magnetization in the same direction or in different directions. For example, the first and second free layers may respectively have perpendicular magnetization, or the first free layer may have perpendicular magnetization and the second free layer may have horizontal magnetization. In addition, the separation layer may be formed of a material with a bcc structure not having magnetization. That is, the first free layer may be perpendicularly magnetized, the separation layer might not be magnetized, and the second free layer may be perpendicularly or horizontally magnetized. When the first free layer has perpendicular magnetization, the second free layer has horizontal magnetization, and the separation layer is disposed between the first and second free layers like this, switching energy may be reduced through magnetic resonance of the first and second free layers. That is, when a spin direction of the first free layer having perpendicular magnetization is changed into an opposite perpendicular direction beyond a horizontal direction, switching energy of the free layer 180 may be lowered by making magnetic resonance with the second free layer having horizontal magnetization. Here, the first and second free layers are respectively formed of CoFeB, and the first free layer is formed more thinly than the second free layer. For example, the first free layer may be formed to a thickness of 0.8 nm to 1.2 nm using CoFeB, the second free layer may be formed to a thickness of 1 nm to 4 nm using CoFeB, and the separation layer may be formed to a thickness of 0.4 nm to 2 nm using a material having a bcc structure.

The second buffer layer 190 is formed on the free layer 180. The second buffer layer 190 is formed of a polycrystalline material, e.g., a conductive material having a bcc structure. For example, the second buffer layer 190 may be formed of tungsten (W). When the second buffer layer 190 is formed of a polycrystalline material, the crystallinity of the MTJ on a lower part thereof may be improved. That is, when the amorphous MTJ is formed on the capping layer 150 having a bcc structure, the amorphous MTJ grows in a crystal direction of the capping layer 150 and the second buffer layer 190 having a bcc structure is formed on the MTJ. Accordingly, when subsequent heat treatment is carried out, the crystallinity of the MTJ may be further improved. Meanwhile, the second buffer layer 190 may be formed to a thickness of, e.g., 1 nm to 4 nm.

The upper electrode 200 is formed on the second buffer layer 190. The upper electrode 200 may be formed using a conductive material such as a metal, a metal oxide, or a metal nitride. For example, the upper electrode 200 may be formed of a single metal selected from the group consisting of tantalum (Ta), ruthenium (Ru), titanium (Ti), palladium (Pd), platinum (Pt), magnesium (Mg), and aluminum (Al), or an alloy thereof.

As described above, in the memory device according to the embodiment of Example 3 of the present invention, the lower electrode 110 is formed of a polycrystalline material and the synthetic antiferromagnetic layer 140 is formed on the lower electrode 110, thereby forming the MTJ. Accordingly, since the fcc (111) structure of the synthetic antiferromagnetic layer 140 is not diffused into an MTJ, the bcc (100) crystal of the MTJ may be preserved. Therefore, a magnetization direction of the MTJ may be rapidly changed, whereby operation speed of a memory may be increased.

Comparison of Conventional Example and Example According to the Present Invention FIGS. 15 and 16 respectively illustrate perpendicular magnetization characteristics in a range of −4 kOe to 4 kOe of a memory device fabricated by laminating an MTJ and a synthetic antiferromagnetic layer on a conventional substrate (FIG. 15) and a memory device fabricated by laminating a synthetic antiferromagnetic layer and an MTJ on the substrate of Example 3 of the present invention (FIG. 16). As illustrated in FIGS. 15 and 16, the conventional case and the case of Example 3 of the present invention have almost the same squareness and a magnetic moment of 800 uemu, which indicates that the two structures have almost the same perpendicular characteristics. However, in the conventional case as illustrated in FIG. 15, perpendicular magnetic characteristics of a pinned layer are deteriorated in a range of −1.5 kOe to 1.5 kOe, whereby an information storage function of the MTJ might not satisfactorily operate. However, in the case of the present invention, diffusion effect of fcc (111) of the synthetic antiferromagnetic layer is prevented, whereby perpendicular magnetic characteristics of the pinned layer are not deteriorated as illustrated in FIG. 16.

FIGS. 17 and 18 illustrate perpendicular magnetization characteristics in a range of −500 Oe to 500 Oe of a memory device fabricated by laminating an MTJ and a synthetic antiferromagnetic layer on a conventional substrate (FIG. 17) and a memory device fabricated by laminating a synthetic antiferromagnetic layer and an MTJ on the substrate of Example 3 of the present invention (FIG. 18). In particular, in this range, perpendicular magnetic characteristics of a free layer, i.e., an information storage layer, are exhibited. As illustrated in FIGS. 17 and 18, the conventional case and the case of Example 3 of the present invention have almost the same squareness and a magnetic moment of 100 uemu, which indicates that the two structures have almost the same perpendicular characteristics.

Hereinafter, a memory device according to an embodiment of Example 4 of the present invention is described with reference to FIGS. 19 to 23.

FIG. 19 illustrates a sectional view of a memory device according to an embodiment of Example 4 of the present invention, particularly a sectional view of an STT-MRAM device.

Referring to FIG. 19, the memory device according to an embodiment of Example 4 of the present invention includes a substrate 100 and a lower electrode 110, a buffer layer 120, a seed layer 130, a free layer 140, a tunnel barrier 150, a pinned layer 160, a capping layer 170, a synthetic antiferromagnetic layer 180, and an upper electrode 190 formed on the substrate 100. Here, the free layer 140, the tunnel barrier 150, and the pinned layer 160 constitute an MTJ.

The substrate 100 may be a semiconductor substrate. For example, the substrate 100 may be a silicon substrate, a gallium arsenide substrate, a silicon germanium substrate, a silicon oxide film substrate, or the like. In this embodiment, a silicon substrate is used. In addition, a selection device including a transistor may be formed on the substrate 100. An insulating layer 105 may be formed on the substrate 100. That is, the insulating layer 105 may be formed to cover a predetermined structure of the selection device, and the insulating layer 105 may include a contact hole configured to expose at least a portion of the selection device. The insulating layer 105 may be formed using a silicon oxide film ($SiO_2$) having an amorphous structure, or the like.

The lower electrode 110 is formed on the insulating layer 105. The lower electrode 110 may be formed using a conductive material such as a metal or a metal nitride. In addition, the lower electrode 110 of Example 4 of the present invention may be formed in at least a dual structure including first and second lower electrodes 112 and 114. Here, the first lower electrode 112 may be formed on the insulating layer 105, and the second lower electrode 114 may be formed on the first lower electrode 112. In addition, the first lower electrode 112 may be formed inside the insulating layer 105, thereby being connected to a selection device formed on the substrate 100. The first and second lower electrodes 112 and 114 may be formed of a polycrystalline material. That is, the first and second lower electrodes 112 and 114 may be formed of a conductive material having a bcc structure. For example, the first lower electrode 112 may be formed of a metal such as tungsten (W), and the second lower electrode 114 may be formed of a metal nitride such as a titanium nitride (TiN) film.

The buffer layer 120 is formed on the lower electrode 110. That is, the buffer layer 120 is formed on the second lower electrode 114. The buffer layer 120 is formed of a material having superior match to the second lower electrode 114 so as to address lattice constant mismatch between the second lower electrode 114 and the seed layer 130. For example, when the second lower electrode 114 is formed of TiN, the buffer layer 120 may be formed using tantalum (Ta) having superior lattice match to TiN. Here, since second lower electrode 114 is polycrystalline although Ta is amorphous, the amorphous buffer layer 120 may grow in a crystal direction of polycrystalline the second lower electrode 114, and crystallinity may be improved due to subsequent heat treatment. Meanwhile, the buffer layer 120 may be formed, for example, to a thickness of 2 nm to 10 nm.

The seed layer 130 is formed on the buffer layer 120. The seed layer 130 may be formed in at least a two-layer structure. For example, the seed layer 130 may be formed in a structure wherein a first seed layer 132 and a second seed layer 134 are laminated. Here, the first and second seed layers 132 and 134 may be formed of a polycrystalline material. In addition, the first seed layer 132 may be formed a material capable of being self-crystallized in a body centered cubic (bcc) structure, and the second seed layer 134 is formed of a material having a bcc structure. For example, the first seed layer 132 may be formed of magnesium oxide (MgO), aluminum oxide ($Al_2O_3$), silicon oxide ($SiO_2$), tantalum oxide ($Ta_2O_5$), silicon nitride (SiNx), aluminum nitride (AlNx), or the like. Preferably, the first seed layer 132 may be formed of magnesium oxide. In addition, the second seed layer 134 may be formed of, for example, tungsten (W). Here, the first seed layer 132 may be formed to a thickness of, for example 1 nm to 1.5 nm, and the second seed layer 134 may be formed to a thickness of, for example, 1 nm to 1.4 nm. That is, the first seed layer 132 is formed more thinly than the tunnel barrier 150 because, when the first seed layer 132 is formed more thickly than the tunnel barrier 150, RA increases and thus a TMR ratio may be lowered. In addition, the second seed layer 134 is formed in a bcc structure. When the second seed layer 134 has a thickness of 1 nm to 1.4 nm, perpendicular magnetic characteristics are exhibited. When the seed layer 130 is formed in a structure wherein the first and second seed layers 132 and 134, e.g., in a structure wherein MgO and W are laminated, the crystallinity of the MTJ including the free layer 140, tunnel barrier 150, and pinned layer 160 formed on the seed layer 130 may be improved. That is, when the polycrystalline seed layer 130 is formed, the amorphous MTJ on the seed layer 130 grows in a crystal direction of the seed layer 130 and, when a subsequent heat treatment process is carried out for PMA, the crystallinity of the MTJ may be improved compared to conventional cases. In addition, by forming the seed layer 130 in a structure wherein MgO and W are laminated, perpendicular magnetic characteristics may be maintained also in the case wherein the free layer 140 is formed of a full-Heusler semimetal-based alloy such as CoFeAl or CoFeAlSi. In particular, when the seed layer 130 is formed using MgO and W, crystallization occurs after heat treatment at a high temperature of 350° C. or more, e.g., 350° C. to 500° C., whereby diffusion of Ta into the tunnel barrier 150 may be prevented and PMA of the MTJ may be maintained by crystallizing the free layer 140 and the pinned layer 160. That is, in the conventional case, Cr or Ru used as the seed layer should be thickly formed to a thickness of about 40 nm so as to use CoFeAl or CoFeAlSi in the free layer 140, and a heat treatment process is carried out at 700° C. or more after forming the seed layer with Cr or Ru so as to secure bcc or bct crystallinity of Cr or Ru, followed by depositing CoFeAl or CoFeAlSi to secure perpendicular magnetic characteristics. However, in the case of the present invention in which the first seed layer 132 is formed using MgO capable of self-crystallizing in a bcc structure and the second seed layer 134 is formed using W having a bcc structure on the first seed layer 132, thereby forming the free layer 140 with CoFeAl or CoFeAlSi, perpendicular magnetic characteristics may be obtained without a separate heat treatment process. Accordingly, when the MTJ is applied to a memory device, operation speed and reliability of the memory device may be improved.

The free layer 140 is formed on the seed layer 130 and is formed of a ferromagnetic material. Magnetization of the free layer 140 is not fixed to one direction and may be changed from one direction to an opposite direction. That is, a magnetization direction of the free layer 140 may be the same as the pinned layer 160 (i.e., parallel) or may be opposite thereto (i.e., anti-parallel). The MTJ may be utilized as a memory device by corresponding information of "0" or "1" to a resistance value that changes according to magnetization arrangement of the free layer 140 and the pinned layer 160. For example, when a magnetization direction of the free layer 140 is parallel to that of the pinned layer 160, a resistance value of the MTJ is decreased. This case may be defined as data "0". In addition, when the magnetization direction of the free layer 140 is anti-parallel to that of the pinned layer 160, a resistance value of the MTJ increases. This case may be defined as data "1." The free layer 140 may be formed using, for example, a ferromagnetic material such as a multilayered thin film wherein a full-Heusler semimetal-based alloy, an amorphous rare-earth element alloy, a magnetic metal (ferromagnetic metal), and a non-magnetic metal are alternately laminated, an alloy having an L10-type crystalline structure, or a cobalt-based alloy. An example of the full-Heusler semimetal-based alloy includes CoFeAl, CoFeAlSi, and the like, and an example of the amorphous rare-earth element alloy includes alloys such as TbFe, TbCo, TbFeCo, DyTbFeCo, and GdTbCo. In addition, an example of the multilayered thin film wherein a non-magnetic metal and a magnetic metal are alternately laminated includes Co/Pt, Co/Pd, CoCr/Pt, Co/Ru, Co/Os, Co/Au, Ni/Cu, CoFeAl/Pd, CoFeAl/Pt, CoFeB/Pd, CoFeB/Pt, and the like. In addition, an example of the alloy having an L10-type crystalline structure includes Fe50Pt50, Fe50Pd50, Co50Pt50, Fe30Ni20Pt50, Co30Ni20Pt50, and the like. In addition, an example of the cobalt-based alloy includes CoCr, CoPt, CoCrPt, CoCrTa, CoCrPtTa, CoCrNb, CoFeB, and the like. Since CoFeAl or CoFeAlSi, used in a full-Heusler semimetal-based magnetic layer, among the materials has a high spin polarization ratio and a low damping coefficient, CoFeAl or CoFeAlSi has superior characteristics to CoFeB. That is, since a spin polarization ratio of CoFeAl or CoFeAlSi is 1 although a spin polarization ratio of a CoFeB magnetic substance is theoretically 0.65, an infinite TMR ratio may be anticipated in MTJ using CoFeAl or CoFeAlSi. In addition, since a damping coefficient of CoFeAl or CoFeAlSi is 0.001 although a damping coefficient of CoFeB is 0.005, the consumption of a current switching an electron spin direction of a free layer is small. Accordingly, in the embodiment of Example 4 of the present invention, the free layer 140 is formed using a single layer, which is formed of CoFeAl or CoFeAlSi, or a dual layer, which is formed by laminating CoFeAl or CoFeAlSi. Here, CoFeAl or CoFeAlSi is formed in a crystalline structure, and then textured in an L21 or B2 crystalline structure, as one type of a bcc (100) crystalline structure by heat treatment.

The tunnel barrier 150 is formed on the free layer 140, thereby separating the free layer 140 from the pinned layer 160. The tunnel barrier 150 allows quantum mechanical tunneling between the free layer 140 and the pinned layer 160. The tunnel barrier 150 may be formed of magnesium oxide (MgO), aluminum oxide ($Al_2O_3$), silicon oxide ($SiO_2$), tantalum oxide ($Ta_2O_5$), silicon nitride (SiNx), aluminum nitride (AlNx), or the like. In the embodiment of Example 4 of the present invention, the tunnel barrier 150 is formed of polycrystalline magnesium oxide. The magnesium oxide is textured into a bcc (100) structure due to subsequent heat treatment. The tunnel barrier 150 may be formed, for example, to a thickness of 1.5 nm to 5 nm.

The pinned layer 160 is formed on the tunnel barrier 150. Magnetization of the pinned layer 160 is fixed into one direction within a predetermined magnetic field range, and may be formed of a ferromagnetic material. For example, magnetization may be fixed in a direction from the top to the bottom. The pinned layer 160, may be formed using, for example, a ferromagnetic material such as a multilayered thin film wherein a full-Heusler semimetal-based alloy, an amorphous rare-earth element alloy, a magnetic metal (ferromagnetic metal), and a non-magnetic metal are alternately laminated, an alloy having an L10-type crystalline structure, or a cobalt-based alloy. Here, the pinned layer 160 may be formed of the same ferromagnetic material as the free layer 140. Particularly, the pinned layer 160 may be formed in a CoFeAl or CoFeAlSi single layer structure or a dual layer structure wherein the CoFeAl and CoFeAlSi single layers are laminated. Here, CoFeAl or CoFeAlSi is formed in a crystalline structure, and then textured is an L21 or B2 crystalline structure by heat treatment.

The capping layer 170 is formed on the pinned layer 160, thereby magnetically separating the pinned layer 160 and the synthetic antiferromagnetic layer 180 from each other. Due to formation of the capping layer 170, magnetization of the synthetic antiferromagnetic layer 180 and the pinned layer 160 each independently occurs. In addition, the capping layer 170 may be formed considering magneto resistance ratios of the free layer 140 and the pinned layer 160 for operation of the MTJ. The capping layer 170 may be formed of a material allowing crystal growth of the synthetic antiferromagnetic layer 180. That is, the capping layer 170 allows first and second magnetic layers 181 and 183 of the synthetic antiferromagnetic layer 180 to grow in a crystal direction. For example, the capping layer 170 may be formed of a metal facilitating crystal growth in a Face Centered Cubic (FCC) (111) direction or a Hexagonal Close-Packed (HCP) structure (001) direction. The capping layer 170 may include a meal selected from the group consisting of tantalum (Ta), ruthenium (Ru), titanium (Ti), palladium (Pd), platinum (Pt), magnesium (Mg), cobalt (Co), aluminum (Al), and tungsten (W), or an alloy thereof. Preferably, the capping layer 170 may be formed of at least any one of tantalum (Ta) and tungsten (W). That is, the capping layer 170 may be formed of tantalum (Ta) or tungsten (W) and may be formed in a laminated Ta/W structure. Meanwhile, the capping layer 170 may be formed to a thickness of 0.3 nm to 0.6 nm. When Ta is used, the capping layer 170 may be formed to a thickness of 0.4 nm to 0.6 nm and, when W is used, the capping layer 170 may be formed to a thickness of 0.35 nm to 0.55 nm. Here, although the pinned layer 160 and the first magnetic layer 181 of the synthetic antiferromagnetic layer 180 should be ferro-coupled to fix a magnetization direction of the pinned layer 160, the magnetization direction of the pinned layer 160 is not fixed and has the same magnetization direction as the free layer 140 due to an increased thickness of the capping layer 170 when the capping layer 170 formed using W is formed to a thickness of 0.55 nm or more. Accordingly, the same magnetization direction and different magnetization directions required in an MRAM device do not occur, whereby the MTJ does not operate as a memory.

The synthetic antiferromagnetic layer 180 is formed on the capping layer 170. The synthetic antiferromagnetic layer 180 is capable of fixing magnetization of the pinned layer 160. The synthetic antiferromagnetic layer 180 includes the first magnetic layer 181, a non-magnetic layer 182, and the second magnetic layer 183. That is, in the synthetic antiferromagnetic layer 180, the first and second magnetic layers 181 and 183 are antiferromagnetically coupled to each other via the non-magnetic layer 182. Here, magnetization directions the first and second magnetic layers 181 and 183 are arranged in anti-parallel. For example, the first magnetic layer 181 may be magnetized in an upper direction (i.e., toward the upper electrode 190), and the second magnetic layer 183 may be magnetized in a lower direction (i.e., toward the MTJ). The first and second magnetic layers 181 and 183 may be formed in a structure wherein a magnetic metal and a non-magnetic metal are alternately laminated. As the magnetic metal, a single metal selected from the group consisting of iron (Fe), cobalt (Co), nickel (Ni), and the like, or an alloy thereof may be used. As the non-magnetic metal, a single metal selected from the group consisting of chromium (Cr), platinum (Pt), palladium (Pd), iridium (Ir), rhodium (Rh), ruthenium (Ru), osmium (Os), rhenium (Re), gold (Au), and copper (Cu), or an alloy thereof may be used. For example, the first magnetic layer 181 and the second magnetic layer 183 may be formed of [Co/Pd]n, [Co/Pt]n or [CoFe/Pt]n, wherein n is an integer of 1 or more. That is, the first and second magnetic layers 181 and 183 may be formed by alternately laminating at least two materials several times. For example, the first magnetic layer 181 may be formed of [Co/Pt]5, and the second magnetic layer 183 may be formed of [Co/Pt]6. The non-magnetic layer 182 is formed between the first magnetic layer 181 and the second magnetic layer 183, and is formed of a non-magnetic material that allows half-magnetic coupling between the first and second magnetic layers 181 and 183. For example, the non-magnetic layer 182 may be formed of a single metal selected from the group consisting of ruthenium (Ru), rhodium (Rh), osmium (Os), rhenium (Re) and chromium (Cr), or an alloy thereof.

The upper electrode 190 is formed on the synthetic antiferromagnetic layer 180. The upper electrode 190 may be formed using a conductive material such as a metal, a metal oxide, or a metal nitride. For example, the upper electrode 190 may be formed of a single metal selected from the group consisting of tantalum (Ta), ruthenium (Ru), titanium (Ti), palladium (Pd), platinum (Pt), magnesium (Mg), and aluminum (Al), or an alloy thereof.

As described above, in the memory device according to embodiments of Example 4 of the present invention, the lower electrode 110 is formed of a polycrystalline material, the polycrystalline seed layer 130 is formed, for example, in a laminated MgO/W structure on the lower electrode 110, and the buffer layer 120 is formed between the lower electrode 110 and the seed layer 130 to improve match therebetween. By forming the lower electrode 110 and the seed layer 130 with a polycrystalline material, the amorphous MTJ formed thereon is formed in a crystalline structure of the seed layer 130, and a further improved crystalline structure, compared to the conventional case, is exhibited due to subsequent heat treatment. In addition, in the present invention, since the first seed layer 132 is formed of MgO that is self-crystallizable in a bcc structure and the second seed layer 134 is formed of W having a bcc structure on the first seed layer 132, thereby forming the seed layer 130, perpendicular magnetic characteristics of the free layer 140 may be obtained without a separate heat treatment process also in the case in which the free layer 140 is formed of CoFeAl or CoFeAlSi. Accordingly, compared to the conventional memory device using CoFeB, the memory device of the present invention may realize a high TMR ratio and may accomplish low-power switch driving. In addition, since the present invention uses the seed layer having an MgO/W structure, diffusion of a Ta buffer layer at a high temperature of 350° C. may be prevented and perpendicular magnetic characteristics of CoFeAl or CoFeAlSi may be maintained. Accordingly, during fabrication of the MTJ, the temperature of a subsequent process may be maintained up to 350° C. In addition, since the present invention does not require a high-temperature heat treatment process that is performed for bcc crystallization of a seed layer based on CoFeAl or CoFeAlSi in the conventional case, process cost and process time may be reduced. In particular, since the thickness of the second seed layer 134 at an upper part of the first MgO seed layer 132 may be reduced to 2 nm or less due to bcc self-crystallization of the first MgO seed layer 132, the seed layer 130 may be formed very thinly compared to the conventional case in which a seed layer is formed to a thickness of about 40 nm.

Comparative Example

FIG. 20 is a graph illustrating perpendicular magnetization characteristics of a CoFeB magnetic layer when a conventional Ta seed layer is used. That is, perpendicular magnetization characteristics of CoFeB were evaluated after forming a TiN lower electrode/Ta seed layer/CoFeB magnetic layer/MgO tunnel barrier structure on a silicon substrate. Here, Ta seed layers were respectively formed to thicknesses of 5 nm, 7 nm, and 10 nm, the CoFeB magnetic layer was formed to a thickness of 1 nm, and the MgO tunnel barrier was formed to a thickness of 2 nm. In addition, heat treatment was respectively carried out at 300° C., 325° C. and 350° C. As illustrated in FIG. 20, since the CoFeB magnetic layer has low thermal stability although the CoFeB magnetic layer may have a high perpendicular magnetization value at 300° C., the perpendicular magnetization value of the CoFeB magnetic layer is gradually decreased at a temperature greater than 300° C. and a coercivity of the CoFeB magnetic layer is decreased and squareness is disappeared at 350° C., which indicates that perpendicular magnetic characteristics are deteriorated.

FIG. 21 is a graph illustrating perpendicular magnetization characteristics of a CoFeAl magnetic layer when a conventional Ta seed layer is used. That is, after forming a TiN lower electrode/Ta seed layer/CoFeAl magnetic layer/MgO tunnel barrier structure on a silicon substrate, perpendicular magnetization characteristics of CoFeAl were evaluated. As in the embodiment of FIG. 20, Ta seed layers were respectively formed to thicknesses of 5 nm, 7 nm, and 10 nm, the CoFeAl magnetic layer was formed to a thickness of 1 nm, and a MgO tunnel barrier was formed to a thickness of 2 nm. As illustrated in FIG. 21, it can be confirmed that, since bcc crystal characteristics are not exhibited although the thickness of the amorphous Ta seed layer increases from 5 nm to 10 nm, the CoFeAl magnetic layer does not grow in an L21 or B2 crystalline structure, whereby perpendicular magnetic characteristics are not exhibited.

FIG. 22 is a graph illustrating perpendicular magnetization characteristics of a CoFeAl magnetic layer when a Ta buffer layer and a W seed layer are used. That is, after forming a TiN lower electrode/Ta buffer layer/W seed layer/ CoFeAl magnetic layer/MgO tunnel barrier structure on a silicon substrate, perpendicular magnetization characteristics of CoFeAl were evaluated. Here, the Ta buffer layer was formed to a thickness of 5 nm, W seed layers were respectively formed to thicknesses of 2 nm, 2.5 nm, 3 nm, and 5 nm, the CoFeAl magnetic layer was formed to a thickness of 1 nm, and the MgO tunnel barrier was formed to a thickness of 2 nm. As illustrated in FIG. 22, it can be confirmed that, since the W seed layer does not exhibit bcc crystal characteristics although the W seed layer having a bcc structure is formed to a thickness of 2 nm to 5 nm on the amorphous Ta buffer layer, the CoFeAl magnetic layer does not grow in an L21 or B2 crystalline structure, whereby perpendicular magnetic characteristics are not exhibited.

Example

FIG. 23 is a graph illustrating perpendicular magnetization characteristics of a CoFeAl magnetic layer dependent upon the thickness of W in a structure, in which a Ta buffer layer and a MgO/W seed layer are formed, according to an embodiment of Example 4 of the present invention. Here, the Ta buffer layer was formed to a thickness of 5 nm, the MgO seed layer was formed to a thickness of 1.2 nm, and the W seed layer was formed to a thickness of 0.8 nm to 1.4 nm. In addition, the CoFeAl magnetic layer was formed to a thickness of 1 nm, and the MgO tunnel barrier was formed to a thickness of 2 nm. Since bcc crystallization is autonomously performed when the thickness of the MgO layer is 1 nm or more, the MgO layer was used as a first seed layer. Here, the MgO seed layer may be formed to a thickness of 1 nm to 1.5 nm. Since RA increases when the MgO seed layer is thicker than the tunnel barrier, a TMR ratio, as an important requirement of p-STT MRAM, is reduced. The W seed layer formed on the MgO seed layer is formed in a bcc structure and, when the thickness of the W seed layer is 1 nm to 1.4 nm, perpendicular magnetic characteristics are exhibited. In addition, unlike a conventional Cr or Ru seed layer, bcc crystallization by separate heat treatment is unnecessary. The CoFeAl magnetic layer formed on the W seed layer is formed in a B2 structure, as a kind of crystalline bcc structure, along a crystalline W bcc structure, whereby perpendicular magnetic characteristics are exhibited.

Hereinafter, a memory device according to an embodiment of Example 5 of the present invention is described with reference to FIGS. 24 to 31.

FIG. 24 illustrates a sectional view of a memory device according to an embodiment of Example 5 of the present invention, particularly a sectional view of an STT-MRAM device.

Referring to FIG. 24, the memory device according to the embodiment of Example 5 of the present invention includes an substrate 100 and a lower electrode 110, first buffer layer 120, seed layer 130, free layer 140, tunnel barrier 150, pinned layer 160, capping layer 170, second buffer layer 180, synthetic antiferromagnetic layer 190, and upper electrode 200 formed on the substrate 100. Here, the free layer 140, the tunnel barrier 150, and the pinned layer 160 constitute an MTJ. In addition, the free layer 140 has a structure wherein the first free layer 141, the separation layer 142, and second free layer 143 are laminated. Here, the first and second free layers 141 and 143 have magnetization in different directions.

The substrate 100 may be a semiconductor substrate. For example, the substrate 100 may be a silicon substrate, a gallium arsenide substrate, a silicon germanium substrate, a silicon oxide film substrate, or the like. In this embodiment, a silicon substrate is used. In addition, a selection device including a transistor may be formed on the substrate 100. An insulating layer 105 may be formed on the substrate 100. That is, the insulating layer 105 may be formed to cover a predetermined structure of the selection device, and the insulating layer 105 may include a contact hole configured to expose at least a portion of the selection device. The insulating layer 105 may be formed using a silicon oxide film ($SiO_2$) having an amorphous structure, or the like.

The lower electrode 110 is formed on the insulating layer 105. The lower electrode 110 may be formed using a conductive material such as a metal or a metal nitride. In addition, the lower electrode 110 of Example 5 of the present invention may be formed in at least one layer structure. Here, the lower electrode 110 may be formed on the insulating layer 105 or inside the insulating layer 105. The lower electrode 110 may be formed inside or on the insulating layer 105, thereby being connected to the selection device formed on the substrate 100. The lower electrode 110 may be formed of a polycrystalline material. That is, the lower electrode 110 may be formed of a conductive material having a bcc structure. For example, the lower electrode 110 may be formed of a metal nitride such as titanium nitride (TiN). Of course, the lower electrode 110 may be formed in at least a two-layer structure including titanium nitride. For example, the lower electrode 110 may be formed in a structure wherein s a metal, such as tungsten (W), and a metal nitride, such as titanium nitride, are laminated. That is, when the lower electrode 110 is formed in at least a dual structure, tungsten may be formed on the insulating layer 105 and titanium nitride may be formed on the tungsten.

The first buffer layer 120 is formed on the lower electrode 110. The first buffer layer 120 is provided to address lattice constant mismatch between the lower electrode 110 and the seed layer 130. To accomplish this, the first buffer layer 120 may be formed of a material having superior match to the lower electrode 110. For example, when the lower electrode 110 is formed of TiN, the first buffer layer 120 may be formed using tantalum (Ta) having superior lattice match to TiN. Here, since the lower electrode 110 is polycrystalline although Ta is amorphous, the amorphous first buffer layer 120 may grow in a crystal direction of the polycrystalline lower electrode 110, and crystallinity may be improved due to subsequent heat treatment. Meanwhile, the first buffer layer 120 may be formed, for example, to a thickness of 2 nm to 10 nm, preferably a thickness of 5 nm.

The seed layer 130 is formed on the buffer layer 120. The seed layer 130 may be formed of a polycrystalline material, e.g., a conductive material having a bcc structure. For example, the seed layer 130 may be formed of tungsten (W). By forming the seed layer 130 with a material having a bcc structure like this, the crystallinity of the MTJ including the free layer 140, tunnel barrier 150, and pinned layer 160 formed on the seed layer 130 may be improved. That is, when the seed layer 130 is formed in a bcc structure, the amorphous MTJ on the seed layer 130 grows in a crystal direction of the seed layer 130 and, when a subsequent heat treatment process is carried out for PMA, the crystallinity of the MTJ may be improved compared to conventional cases. In particular, when W is used in the seed layer 130, crystallization occurs after heat treatment at high temperature such as 400° C. or more, for example 400° C. to 500° C., whereby diffusion of a capping layer material, a synthetic antiferromagnetic layer material, and the like into the tunnel barrier 150 may be prevented and PMA of the MTJ may be maintained by crystallizing the free layer 140 and the pinned layer 160. That is, in a conventional case in which an amorphous seed layer and an amorphous MTJ are formed on an amorphous insulating layer, the crystallinity of an MTJ is not improved although heat treatment is carried out. By the way, when the crystallinity of the MTJ is improved according to the present invention, magnetization further greatly occurs upon application of a magnetic field, and the amount of a current flowing through the MTJ in a parallel state further increases. Accordingly, when the MTJ is applied to a memory device, operation speed and reliability of the memory device may be improved. Meanwhile, the seed layer 130 may be formed, for example, to a thickness of 1 nm to 3 nm.

The free layer 140 is formed on the seed layer 130 and is formed of a ferromagnetic material. Magnetization of the free layer 140 is not fixed to one direction and may be changed from one direction to an opposite direction. That is, a magnetization direction of the free layer 140 may be the same as the pinned layer 160 (i.e., parallel) or may be opposite thereto (i.e., anti-parallel). The MTJ may be utilized as a memory device by corresponding information of "0" or "1" to a resistance value that changes according to magnetization arrangement of the free layer 140 and the pinned layer 160. For example, when a magnetization direction of the free layer 140 is parallel to that of the pinned layer 160, a resistance value of the MTJ is decreased. This case may be defined as data "0". In addition, when the magnetization direction of the free layer 140 is anti-parallel to that of the pinned layer 160, a resistance value of the MTJ increases. This case may be defined as data "1." The free layer 140 according to the present invention is formed in a structure wherein the first free layer 141, the separation layer 142, and second free layer 143 are laminated. Here, the first and second free layers 141 and 143 may have magnetization in different directions, and the separation layer 142 does not have magnetization. For example, the first free layer 141 may have horizontal magnetization, and the second free layer 143 may have perpendicular magnetization. That is, the first free layer 141 may be horizontally magnetized, the separation layer 142 might not be magnetized, and the second free layer 143 may be perpendicularly magnetized. In addition, when CoFeB is used such that the first free layer 141 has horizontal magnetization, CoFeB may be formed to a thickness of 1 nm to 4 nm and, when CoFeB is used such that the second free layer 143 has perpendicular magnetization, CoFeB may be formed to a thickness of 0.8 nm to 1.2 nm. Of course, the first and second free layers 141 and 143 may be formed of different materials or processes thereof may be different such that the first and second free layers 141 and 143 have magnetization in different directions. In addition, the separation layer 142 may be formed to a thickness of 0.4 nm to 2 nm with a material having a bcc structure. The separation layer 142 may be formed of a material having a bcc structure to form the tunnel barrier 150 in a bcc structure. For example, the separation layer 142 may be formed of W. By disposing the separation layer 142 between the first free layer 141 having horizontal magnetization and the second free layer 143 having perpendicular magnetization like this, switching energy may be reduced due to magnetic resonance of the first and second free layers 141 and 143. That is, when a spin direction of the second free layer 143 having perpendicular magnetization is changed into an opposite perpendicular direction beyond a horizontal direction, switching energy of the free layer 140 may be lowered by making magnetic resonance with the first free layer 141 having horizontal magnetization. Meanwhile, the first and second free layers 141 and 143 may be formed of a variety of materials in addition to CoFeB. For example, the first and second free layers 141 and 143 may be formed using, for example, a ferromagnetic material such as a multilayered thin film wherein a full-Heusler semimetal-based alloy, an amorphous rare-earth element alloy, a magnetic metal (ferromagnetic metal), and a non-magnetic metal are alternately laminated, an alloy having an L10-type crystalline structure, or a cobalt-based alloy. An example of the full-Heusler semimetal-based alloy includes CoFeAl, CoFeAlSi, and the like, and an example of the amorphous rare-earth element alloy includes alloys such as TbFe, TbCo, TbFeCo, DyTbFeCo, and GdTbCo. In addition, an example of the multilayered thin film wherein a non-magnetic metal and a magnetic metal are alternately laminated includes Co/Pt, Co/Pd, CoCr/Pt, Co/Ru, Co/Os, Co/Au, Ni/Cu, CoFeAl/Pd, CoFeAl/Pt, CoFeB/Pd, CoFeB/Pt, and the like. In addition, an example of the alloy having an L10-type crystalline structure includes Fe50Pt50, Fe50Pd50, Co50Pt50, Fe30Ni20Pt50, Co30Ni20Pt50, and the like. In addition, an example of the cobalt-based alloy includes CoCr, CoPt, CoCrPt, CoCrTa, CoCrPtTa, CoCrNb, CoFeB, and the like. A single layer formed of CoFeB thereamong may be thickly formed compared to a multilayered structure including CoFeB and Co/Pt or Co/Pd, whereby a magneto resistance ratio may be increased. In addition, since CoFeB may be easily etched compared to a metal such as Pt or Pd, a CoFeB single layer may be easily fabricated compared to a multilayered structure containing Pt, Pd, or the like. Further, CoFeB may have perpendicular magnetization as well as horizontal magnetization due to thickness adjustment. Accordingly, in the embodiment of Example 5 of the present invention, the first and second free layers 141 and 143 are formed using a CoFeB single layer and CoFeB is formed in an amorphous state, followed by being textured in a bcc (100) structure by heat treatment.

The tunnel barrier 150 is formed on the free layer 140, thereby separating the free layer 140 from the pinned layer 160. The tunnel barrier 150 allows quantum mechanical tunneling between the free layer 140 and the pinned layer 160. The tunnel barrier 150 may be formed of magnesium oxide (MgO), aluminum oxide ($Al_2O_3$), silicon oxide ($SiO_2$), tantalum oxide ($Ta_2O_5$), silicon nitride (SiNx), aluminum nitride (AlNx), or the like. In the embodiment of Example 5 of the present invention, the tunnel barrier 150 is formed of polycrystalline magnesium oxide. The magnesium oxide is textured into a bcc (100) structure due to subsequent heat treatment.

The pinned layer 160 is formed on the tunnel barrier 150. Magnetization of the pinned layer 160 is fixed into one direction within a predetermined magnetic field range, and may be formed of a ferromagnetic material. For example, magnetization may be fixed in a direction from the top to the bottom. The pinned layer 160, may be formed using, for example, a ferromagnetic material such as a multilayered thin film wherein a full-Heusler semimetal-based alloy, an amorphous rare-earth element alloy, a magnetic metal (ferromagnetic metal), and a non-magnetic metal are alternately laminated, an alloy having an L10-type crystalline structure, or a cobalt-based alloy. Here, the pinned layer 160 may be formed of the same ferromagnetic material as the free layer 140, particularly formed as a CoFeB single layer. CoFeB is formed in an amorphous state, and then textured in a BCC (100) structure due to heat treatment.

The capping layer 170 is formed on the pinned layer 160, thereby magnetically separating the pinned layer 160 and the synthetic antiferromagnetic layer 190 from each other. Due to formation of the capping layer 170, magnetization of the synthetic antiferromagnetic layer 190 and the pinned layer 160 each independently occurs. In addition, the capping layer 170 may be formed considering magneto resistance ratios of the free layer 140 and the pinned layer 160 for operation of the MTJ. The capping layer 170 may be formed of a material allowing crystal growth of the synthetic antiferromagnetic layer 190. That is, the capping layer 170 allows first and second magnetic layers 191 and 193 of the synthetic antiferromagnetic layer 190 to grow in a crystal direction. For example, the capping layer 170 may be formed of a metal facilitating crystal growth in a Face Centered Cubic (FCC) (111) direction or a Hexagonal Close-Packed (HCP) structure (001) direction. The capping layer 170 may include a meal selected from the group consisting of tantalum (Ta), ruthenium (Ru), titanium (Ti), palladium (Pd), platinum (Pt), magnesium (Mg), cobalt (Co), aluminum (Al), and tungsten (W), or an alloy thereof. Preferably, the capping layer 170 may be formed of at least any one of tantalum (Ta) and tungsten (W). That is, the capping layer 170 may be formed of tantalum (Ta) or tungsten (W) and may be formed in a laminated Ta/W structure. Meanwhile, the capping layer 170 may be formed to a thickness of 0.3 nm to 0.6 nm. When Ta is used, the capping layer 170 may be formed to a thickness of 0.4 nm to 0.6 nm and, when W is used, the capping layer 170 may be formed to a thickness of 0.35 nm to 0.55 nm. Here, although the pinned layer 160 and the first magnetic layer 181 of the synthetic antiferromagnetic layer 190 should be ferro-coupled to fix a magnetization direction of the pinned layer 160, the magnetization direction of the pinned layer 160 is not fixed and has the same magnetization direction as the free layer 140 due to an increased thickness of the capping layer 170 when the capping layer 170 formed using W is formed to a thickness of 0.55 nm or more. Accordingly, the same magnetization direction and different magnetization directions required in an MRAM device do not occur, whereby the MTJ does not operate as a memory.

The second buffer layer 180 is formed on the capping layer 170. The second buffer layer 180 is formed to resolve lattice constant mismatch between the capping layer 170 and the synthetic antiferromagnetic layer 180. The second buffer layer 180 may be formed of, for example, the same material as the synthetic antiferromagnetic layer 180. For example, the second buffer layer 180 may be formed in a single layer structure wherein Co and Pt are laminated.

The synthetic antiferromagnetic layer 190 is formed on the second buffer layer 180. The synthetic antiferromagnetic layer 190 is formed on the capping layer 170, thereby fixing magnetization of the pinned layer 160. The synthetic antiferromagnetic layer 190 includes the first magnetic layer 191, a non-magnetic layer 192, and the second magnetic layer 193. In the synthetic antiferromagnetic layer 190, the first and second magnetic layers 191 and 193 are antiferromagnetically coupled to each other via the non-magnetic layer 192. Here, magnetization directions the first and second magnetic layers 191 and 193 are arranged in anti-parallel. For example, the first magnetic layer 191 may be magnetized in an upper direction (i.e., toward the upper electrode 200), and the second magnetic layer 193 may be magnetized in a lower direction (i.e., toward the MTJ). The first and second magnetic layers 191 and 193 may be formed in a structure wherein a magnetic metal and a non-magnetic metal are alternately laminated. As the magnetic metal, a single metal selected from the group consisting of iron (Fe), cobalt (Co), nickel (Ni), and the like, or an alloy thereof may be used. As the non-magnetic metal, a single metal selected from the group consisting of chromium (Cr), platinum (Pt), palladium (Pd), iridium (Ir), rhodium (Rh), ruthenium (Ru), osmium (Os), rhenium (Re), gold (Au), and copper (Cu), or an alloy thereof may be used. For example, the first magnetic layer 191 and the second magnetic layer 193 may be formed of [Co/Pd]n, [Co/Pt]n or [CoFe/Pt]n, wherein n is an integer of 1 or more. The non-magnetic layer 192 is formed between the first magnetic layer 191 and the second magnetic layer 193, and is formed of a non-magnetic material allowing half-magnetic coupling between the first magnetic layer 191 and the second magnetic layer 193. For example, the non-magnetic layer 192 may be formed of a single metal selected from the group consisting of ruthenium (Ru), rhodium (Rh), osmium (Os), rhenium (Re) and chromium (Cr), or an alloy thereof.

The upper electrode 200 is formed on the synthetic antiferromagnetic layer 190. The upper electrode 200 may be formed using a conductive material such as a metal, a metal oxide, or a metal nitride. For example, the upper electrode 200 may be formed of a single metal selected from the group consisting of tantalum (Ta), ruthenium (Ru), titanium (Ti), palladium (Pd), platinum (Pt), magnesium (Mg), and aluminum (Al), or an alloy thereof.

As described above, since the lower electrode 110 of the memory device according to the embodiment of Example 5 of the present invention is formed using a polycrystalline conductive material, e.g., TiN, it is possible to apply 1T1M, as a basic structure of an STT-MRAM, to an actual memory fabrication process. In addition, since the free layer 130 is formed by laminating the first free layer 141 having horizontal magnetization, the separation layer 142 having no magnetization, and the second free layer 143 having perpendicular magnetization, switching energy of the free layer 140 may be lowered while maintaining magnetization characteristics and a magneto resistance ratio of the MTJ by making magnetic resonance with the first free layer 141 having horizontal magnetization when a spin direction of the second free layer 143 having perpendicular magnetization is changed into an opposite perpendicular direction beyond a horizontal direction.

Comparison of Conventional Example and Example According to the Present Invention FIGS. 25 to 28 illustrate magnetic characteristics of memory devices fabricated by performing heat treatment at 400° C. after forming an MTJ and capping layer on a substrate and performing heat treatment at 350° C. after forming a synthetic antiferromagnetic layer and an upper electrode. That is, FIGS. 25 and 26 illustrate magnetic characteristics of a conventional MTJ including a free layer that is formed in a single layer structure and the free layer, and FIGS. 27 and 28 illustrate magnetic characteristics of the MTJ of Example 5 of the present invention including a free layer constituted of the first and second free layers having different magnetization directions and the free layer. Here, FIG. 26 is an enlarged view of portion A of FIG. 25, and FIG. 28 is an enlarged view of portion B of FIG. 27. As illustrated in FIGS. 27 and 28, it can be confirmed that, in the case of the present invention, coercivity and squareness of the free layer are satisfactorily maintained as in the conventional case illustrated in FIGS. 25 and 26. By the way, it can be confirmed that, in the conventional case, the free layer has only perpendicular magnetization as illustrated in FIG. 26, but, in the case of Example 5 of the present invention, the free layer has horizontal magnetization as well as perpendicular magnetization as illustrated in FIG. 28.

FIGS. 29 and 30 illustrate switching current characteristics of a conventional case in which a free layer is formed in a single layer structure, and the case of Example 5 of the present invention in which a free layer is constituted of first and second free layers having magnetization directions. That is, FIG. 29 illustrates a switching current when a free layer is changed from a parallel state to a pinned layer to an antiparallel state thereto by applying a pulse of 10 ns, and FIG. 30 illustrates a switching current when the free layer is changed from an anti-parallel state to the pinned layer to a parallel state thereto. As illustrated in FIG. 29, a switching current of the present invention is about 60% lower compared to the conventional case when an anti-parallel state is changed into a parallel state, and a switching current of the present invention is about 40% lower compared to the conventional case when a parallel state is changed into an anti-parallel state as illustrated in FIG. 30.

FIG. 31 is a drawing illustrating a magneto resistance ratio (C) dependent upon the thickness of a conventional seed layer and a magneto resistance ratio (D) dependent upon the thickness of the separation layer of Example 5 of the present invention. That is, to measure a magneto resistance ratio, a seed layer was formed on a TiN lower electrode and an MTJ formed by laminating a CoFeB free layer, a MgO tunnel barrier, and a CoFeB pinned layer was formed. Here, in the conventional case, the free layer was formed in a single layer structure and, in Example 5 of the present invention, a separation layer having a bcc structure was formed between two free layers having horizontal magnetization and perpendicular magnetization. In addition, a magneto resistance ratio was measured while changing the thickness of the seed layer in the conventional case, and a magneto resistance ratio was measured while changing the thickness of the separation layer in the case of the present invention. As illustrated by graph C, it can be confirmed that a magneto resistance ratio is decreased with increasing thickness of the seed layer, and a maximum value thereof is about 147%. In addition, as illustrated by graph D, it can be confirmed that a magneto resistance ratio increases with increasing thickness of the separation layer, and a maximum value thereof is about 150%. Accordingly, a magneto resistance ratio in the case in which two free layers are formed is maintained similarly to the case in which a single free layer is formed.

While this invention has been particularly shown and described with reference to embodiments thereof, the preferred embodiments should be considered in descriptive sense only and not for purposes of limitation. In addition, it will be understood by those skilled in the art that various changes in form and details may be made therein without departing from the spirit and scope of the invention.

The invention claimed is:

1. A memory device, comprising a substrate and a lower electrode, buffer layer, seed layer, synthetic antiferromagnetic layer, capping layer, Magnetic Tunnel Junction (MTJ), and upper electrode formed on the substrate,
    wherein the synthetic antiferromagnetic layer comprises a first magnetic layer having a single layer structure; a non-magnetic layer; and a multilayered second magnetic layer.

2. The memory device according to claim 1, wherein a free layer of the MTJ comprises a first magnetization layer having horizontal magnetization; a separation layer having no magnetization; and a second magnetization layer having perpendicular magnetization.

3. The memory device according to claim 1, wherein first and second free layers of the MTJ are formed of a material comprising CoFeB, and the first free layer is formed more thickly than the second free layer.

4. The memory device according to claim 1, wherein the first magnetic layer is formed in a single Co/Pt layer structure, and the second magnetic layer is formed in a multilayered structure comprising Co/Pt laminated at least twice.

5. A memory device, comprising a substrate and a lower electrode, buffer layer, seed layer, synthetic antiferromagnetic layer, capping layer, Magnetic Tunnel Junction (MTJ), and upper electrode formed on the substrate, wherein the capping layer is formed of at least two layers.

6. The memory device according to claim 5, wherein a first capping layer, which is adjacent to the MTJ, of the capping layer is formed of a material having a bcc structure, and a second capping layer adjacent to the synthetic antiferromagnetic layer is formed of a material preventing the synthetic antiferromagnetic layer material from being diffused downwardly.

7. A memory device, comprising a substrate and a lower electrode, buffer layer, seed layer, synthetic antiferromagnetic layer, capping layer, Magnetic Tunnel Junction (MTJ), and upper electrode formed on the substrate, wherein the synthetic antiferromagnetic layer is formed in a structure wherein a first magnetic layer, a non-magnetic layer, and a second magnetic layer are laminated, and the first and second magnetic layers are formed of a material comprising Pt.

8. The memory device according to claim 7, wherein the first magnetic layer is formed in a multilayered structure comprising Co/Pt laminated at least twice, and the second magnetic layer is formed in a single Co/Pt layer structure.

9. A memory device, comprising a substrate and a lower electrode, buffer layer, seed layer, synthetic antiferromagnetic layer, capping layer, Magnetic Tunnel Junction (MTJ), and upper electrode formed on the substrate, wherein a free layer of the MTJ comprises a first magnetization layer having perpendicular magnetization; a separation layer having no magnetization; and a second magnetization layer having perpendicular magnetization, wherein the first magnetization layer is formed adjacent to a pinned layer of the MJT.

10. The memory device according to claim 9, wherein first and second free layers of the free layer are formed of a material comprising CoFeB, and the first free layer is formed more thinly than the second free layer.

11. A memory device, comprising a substrate and a lower electrode, seed layer, and MTJ laminated on the substrate, wherein the seed layer is formed in at least a dual structure, and at least one layer of the dual structure has a bcc structure.

12. The memory device according to claim 11, wherein the lower electrode is formed in a structure wherein a first lower electrode comprising tungsten and a second lower electrode comprising TiN are laminated.

13. The memory device according to claim 11, wherein the seed layer is formed in a structure wherein a first seed layer self-crystallizable to bcc and a second seed layer having a bcc structure are laminated.

14. The memory device according to claim 13, wherein the first seed layer is formed thinly than a tunnel barrier of the MTJ.

15. The memory device according to claim 14, wherein the first seed layer is formed to a thickness of 1 nm to 1.5 nm, and the second seed layer is formed to a thickness of 1 nm to 1.4 nm.

16. A memory device, comprising an MTJ that comprises a free layer, a tunnel barrier, and a pinned layer,
wherein the free layer is formed in at least a two-layer structure having different magnetization directions.

17. The memory device according to claim 16, wherein the free layer is adjacent to the pinned layer and has perpendicular magnetization.

18. The memory device according to claim 16, wherein the free layer comprises a first magnetization layer having horizontal magnetization; a separation layer having no magnetization; and a second magnetization layer having perpendicular magnetization.

19. The memory device according to claim 18, wherein a first free layer of the free layer is formed to a thickness of 1 nm to 4 nm, and a second free layer of the free layer is formed to a thickness of 0.8 nm to 1.2 nm.

* * * * *